(12) United States Patent
Izuno et al.

(10) Patent No.: US 7,811,946 B2
(45) Date of Patent: Oct. 12, 2010

(54) SEMICONDUCTOR DEVICE AND METHOD FOR MANUFACTURING THE SAME

(75) Inventors: Kunihiro Izuno, Anan (JP); Shinsuke Sofue, Anan (JP)

(73) Assignee: Nichia Corporation, Anan-shi (JP)

( * ) Notice: Subject to any disclaimer, the term of this patent is extended or adjusted under 35 U.S.C. 154(b) by 32 days.

(21) Appl. No.: 12/382,981

(22) Filed: Mar. 27, 2009

(65) Prior Publication Data

US 2009/0239388 A1     Sep. 24, 2009

Related U.S. Application Data

(62) Division of application No. 11/015,283, filed on Dec. 20, 2004, now Pat. No. 7,528,077.

(30) Foreign Application Priority Data

Dec. 22, 2003    (JP)    ............................ 2003-424432

(51) Int. Cl.
  *H01L 21/31* (2006.01)
  *H01L 21/469* (2006.01)
(52) U.S. Cl. ........................ 438/778; 438/124; 438/126; 438/127; 438/780; 438/782; 257/E23.116; 257/E23.132; 257/E21.502
(58) Field of Classification Search .................... 438/7, 438/25, 26, 31, 106, 124, 126, 127, 778, 438/780, 782; 257/E23.116, E23.132, E21.502
See application file for complete search history.

(56) References Cited

U.S. PATENT DOCUMENTS

| | | | |
|---|---|---|---|
| 5,108,541 A | * | 4/1992 | Schneider et al. ............. 216/19 |
| 5,331,203 A | * | 7/1994 | Wojnarowski et al. ...... 257/698 |
| 5,473,814 A | | 12/1995 | White |
| 5,535,526 A | | 7/1996 | White |
| 6,642,652 B2 | | 11/2003 | Collins, III et al. |

(Continued)

FOREIGN PATENT DOCUMENTS

JP    2001-135861 A    5/2001

(Continued)

*Primary Examiner*—Michelle Estrada
(74) *Attorney, Agent, or Firm*—Westerman, Hattori, Daniels & Adrian, LLP

(57) ABSTRACT

The present invention provides a semiconductor device having a coating film of a predetermined thickness provided along the circumference of a semiconductor light emitting element, and provide a method for easily manufacturing the semiconductor device.

A semiconductor light emitting element 2 that emits blue light is mounted face down on the top face of a pedestal 1, and a coating film 3 containing a YAG fluorescent material 6 that emits yellow light is placed so as to cover the top face and side face of the semiconductor light emitting element 2 and the top face of the pedestal 1. With the semiconductor light emitting element 2 and other elements placed between a first film 8 and a second film 9, the films are laminated in vacuum, thereby to fasten the coating film 3 onto the semiconductor light emitting element 2. Then the first film 8 and the second film 9 are removed, the coating film 3 is trimmed and the pedestal 1 is diced, thereby to obtain the semiconductor device 100 having the coating film 3 of a predetermined thickness provided along the circumference of the semiconductor light emitting element 2.

10 Claims, 15 Drawing Sheets

U.S. PATENT DOCUMENTS

| | | |
|---|---|---|
| 6,650,044 B1 | 11/2003 | Lowery |
| 6,673,710 B1 * | 1/2004 | Lin .......................... 438/611 |
| 2003/0059979 A1 * | 3/2003 | Ukita et al. ................ 438/113 |
| 2004/0180474 A1 * | 9/2004 | Oman ........................ 438/125 |
| 2005/0018402 A1 * | 1/2005 | Oman et al. ................ 361/709 |

FOREIGN PATENT DOCUMENTS

| | | |
|---|---|---|
| JP | 2002-185048 A | 6/2002 |
| JP | 2003-110153 A | 4/2003 |

* cited by examiner

SEMICONDUCTOR DEVICE AND METHOD FOR MANUFACTURING THE SAME

CROSS-REFERENCE TO RELATED APPLICATIONS

This application is a division of U.S. application Ser. No. 11/015,283, filed on Dec. 20, 2004 now U.S. Pat. No. 7,528,077 which is based upon and claims the benefit of priority from the prior Japanese Patent Application No. 2003-424432, filed on Dec. 22, 2003, the entire contents of which are incorporated herein by reference.

BACKGROUND OF THE INVENTION

1. Field of the Invention

The present invention relates to a semiconductor device comprising a semiconductor element covered with a coating film and a method for manufacturing the same, and particularly to a semiconductor device comprising a semiconductor light emitting element that is covered and a method for manufacturing the same.

2. Description of the Related Art

Methods of forming a coating film on a semiconductor element in the prior art include those that employ potting means or screen printing means. FIG. 14 is a sectional view schematically showing a process of a conventional film forming method that employs the potting means. FIG. 15 is a sectional view schematically showing a process of a conventional film forming method that employs the screen printing means. The processes will be described below with reference to these drawings.

A semiconductor device 200 is made by using the potting means. The semiconductor device 200 comprises a semiconductor element 210 mounted face down in a cavity 211 of a predetermined shape. Top face and side face of the semiconductor element 210 are covered with a coating film 212. The semiconductor element 210 is electrically connected with a lead electrode 215 that is formed integrally with the cavity 211. The semiconductor device 200 has the semiconductor element 210 that is mounted face down on the lead electrode 215 in advance. A resin 213 is dropped from a thin tube 214 onto the top face of the semiconductor element 210. Resin supply is stopped when the resin has completely covered the top face and side face of the semiconductor element 210, so as to harden the resin 214. Thus the coating film 212 is formed on the top face and side face of the semiconductor element 210.

A semiconductor device 300 is made by using the screen printing means. The semiconductor device 300 comprises a semiconductor element 310 mounted face down on the top surface of a substrate 311. Top face and side face of the semiconductor element 310 are covered with a coating film 312. The semiconductor element 310 is electrically connected with a lead electrode 315 that is formed on the substrate 311. The semiconductor device 300 is made by providing a side wall 316 that serves as a mask having a predetermined shape, spreading a resin 313 with a squeegee 314, thereby forming the coating film 312 on the top face of the semiconductor element 310. After forming the coating film 312, the side wall 316 serving as a mask is removed, thus having the coating film 312 formed on the top face and side face of the semiconductor element 310.

However, the semiconductor device 200 made by using the conventional potting means and the semiconductor device 500 made by using the conventional screen printing means have problems as described below.

In the semiconductor device 200 made by using the conventional potting means, the coating film 212 that covers the top face and side face of the semiconductor element 210 cannot be formed with uniform thickness. For example, when a semiconductor light emitting element is used as the semiconductor element 210 and a fluorescent material is mixed in the coating film 212, difference in thickness of the film among products results in variability in color between products as light emitted by the semiconductor light emitting element is absorbed by the fluorescent material and light of different wavelength generated by the fluorescent material is emitted to the outside. In addition, since the coating film is thicker in the portion where resin 213 has been dropped from the thin tube 214 and thinner in the surrounding portion, larger amount of light emitted by the fluorescent material 6 emerges from the potted portion, while smaller amount of light emitted by the fluorescent material 6 emerges from the surrounding portion, thus resulting in color unevenness.

In the semiconductor device 300 made by using the conventional screen printing means, it is difficult to form the coating film 312 that covers the top face and the side face of the semiconductor element 310 with uniform thickness. It is also difficult to manufacture, as the coating film 312 may come off along with the side wall 316 that makes the mask when the side wall 316 is removed from the coating film 312.

SUMMARY OF THE INVENTION

With the background described above, it is an object of the present invention to provide a semiconductor device that has a coating film of a predetermined thickness provided on the periphery of a semiconductor element. It is also an object of the present invention to provide a method of easily manufacturing the semiconductor device.

In order to solve the problems described above, the inventors of the present application conducted a research and completed the present invention.

The present invention has such a constitution so as to achieve effects as described below. In the description that follows, effects of the present invention will be described by replacing the semiconductor element with a semiconductor light emitting element, but the present invention is not limited to this constitution.

The semiconductor device of the present invention comprises a semiconductor element, a pedestal on which the semiconductor element is placed, and a coating film that covers at least a part of the top face and side face of the semiconductor element and the top face of the pedestal, wherein at least two of first thickness of the coating film in a portion thereof that covers the top face of the semiconductor element, second thickness of the coating film in a portion thereof that covers the side face of the semiconductor element and third thickness of the coating film in a portion thereof the covers the top face of the pedestal are substantially equal to each other, and the external surface of the coating film that covers the edge between the top face and the side face of the semiconductor element has a rounded shape, and the external surface of the coating film that covers the boundary between the side face of the semiconductor element and the top face of the pedestal has a rounded shape.

According to the semiconductor device of the present invention having the constitution described above, the semiconductor device having the coating film of a predetermined thickness can be provided. It also enables it to protect the semiconductor device from external disturbance such as moisture and dust. In addition, in case a fluorescent material that absorbs light emitted by the semiconductor light emitting element and transforms the wavelength thereof is mixed in the coating film, for example, such a semiconductor device can be provided that emits light of a predetermined color with less color unevenness through blending of light emitted by the semiconductor light emitting element and light emitted by the fluorescent material.

In the semiconductor device of the present invention, radius of curvature of the external surface of the rounded coating film that covers the edge is preferably not smaller than $(1/2)N$ and not larger than $3M$, where M is larger one of the first thickness and the second thickness and N is the smaller one thereof. This makes it possible to completely cover the edge that is the intersect between the top face and the side face of the semiconductor element, and also to provide a flat portion on the top face of the semiconductor element. As a result, in case a coating film having a fluorescent material mixed therein and the semiconductor light emitting element are used, such a semiconductor device can be provided that emits light with less color unevenness. In case the first thickness and the second thickness are equal, M and N are equal to each other.

In the semiconductor device of the present invention, it is preferable that radius of curvature of the external surface of the rounded coating film that covers the boundary is not smaller than $(1/2)T$ and not larger than $3S$, where S is larger one of the second thickness and the third thickness and T is the smaller one thereof. In case the second thickness and the third thickness are equal, S and T are equal to each other.

According to the present invention, it is preferable that the difference between the maximum value and the minimum value of thickness of the coating film that covers the top face of the semiconductor element is within $1/10$ of the arithmetic mean of the thicknesses of the coating film that covers the top face of the semiconductor element, and the first thickness is the arithmetic mean. By forming such a coating film having uniform thickness, a semiconductor device that emits light with less color unevenness can be provided when the coating film having a fluorescent material mixed therein and the semiconductor light emitting element are used.

Also according to the present invention, it is preferable that the difference between the maximum value and the minimum value of thickness of the coating film that covers the side face of the semiconductor element is within $1/10$ of the arithmetic mean of the thicknesses of the coating film that covers the side face of the semiconductor element, and the second thickness is the arithmetic mean.

By forming such a coating film having uniform thickness, a semiconductor device that emits light with less color unevenness can be provided when the coating film having the fluorescent material mixed therein and the semiconductor light emitting element are used. Particularly by forming the coating film having uniform thickness on the top face and the side face of the semiconductor light emitting element, directivity of light emitted from the top face and the side face of the semiconductor light emitting element can be improved.

According to the present invention, it is preferable that the difference between the maximum value and the minimum value of thickness of the coating film that covers the top face of the pedestal is within $1/10$ of the arithmetic mean of the thicknesses of the coating film that covers the top face of the pedestal, while the third thickness is the arithmetic mean. This constitution makes it possible to efficiently extract light from the semiconductor light emitting element, since light emitted from the side face of the semiconductor light emitting element toward the pedestal is also absorbed by the fluorescent material mixed in the coating film.

The contact area between the pedestal and the coating film is preferably larger than the cross sectional area of the coating film at the middle of the side face of the semiconductor element. This makes it possible to increase the bonding strength between the pedestal and the coating film.

The semiconductor light emitting element may also be used as the semiconductor element. This constitution makes it possible to improve the efficiency of extracting light from the semiconductor light emitting element, since the difference in refractive index between the semiconductor light emitting element and the coating film is smaller than the difference in refractive index between the semiconductor light emitting element and air.

The coating film preferably contains a fluorescent material, a pigment or a dispersant mixed therein. For example, by mixing a fluorescent material or a pigment in the coating film, such a semiconductor device can be provided that emits light of a predetermined color through transformation of wavelength of light emitted by the semiconductor light emitting element. When a dispersant is mixed in the coating film, for example, a semiconductor device having improved effect of diffusing light can be provided. The amount of the fluorescent material mixed in the coating film can be substantially controlled by adjusting the film thickness, so that color tone of light emitted by the semiconductor device can be easily controlled.

The coating film may consist of two or more films. By covering with two or more films, light emitting devices of various colors can be provided. In view of the efficiency of transforming the wavelength, it is preferable to place a coating film that contains a fluorescent material which emits light of longer wavelength at a position near the semiconductor element and place a coating film that contains a fluorescent material which emits light of shorter wavelength at a position far from the semiconductor element. For example, such a constitution may be employed as the top face of the semiconductor element is covered with a coating film that contains a silicon nitride-based fluorescent material that emits red light and the coating film that contains the silicon nitride-based fluorescent material is covered with a YAG-based fluorescent material that emits yellow-green to yellow light. This constitution enables it to provide a light emitting device that emits light of incandescent lamp having high color rendering performance. Such a constitution may also be employed as a semiconductor element that emits ultraviolet ray is used, while the top face of the semiconductor element is covered with a coating film that contains an alkaline rare earth element halogen apatite-based fluorescent material that emits blue light and the coating film that contains the alkaline rare earth element halogen apatite-based fluorescent material is covered with a YAG-based fluorescent material that emits yellow-green to yellow light. This constitution enables it to provide a light emitting device that emits white light.

The external surface of the coating film provided on the top face of the semiconductor element may have protrusions and recesses. The protrusions of the coating film are caused mainly by a fluorescent material, a pigment or a dispersant. Providing the protrusions or recesses on the external surface of the coating film enables it to improve the efficiency of extracting light.

The interface between the top face of the semiconductor element and the coating film is preferably smooth. This enables it to increase the bonding strength between the semiconductor element and the coating film. In case there are protrusions or recesses in the interface between the top face of the semiconductor element and the coating film, in particular, light emitted by the semiconductor light emitting element may be reflected on the interface resulting in a decrease in the efficiency of extracting light.

The coating film is preferably a soft film. This relaxes stress thereby preventing the semiconductor element from being broken, even when the coating film undergoes thermal expansion due to the heat generated as the semiconductor element operates.

The coating film is preferably made of a silicone resin composition because of high permeability to light and high heat resistance thereof.

The coating film may also have adhesiveness, since it provides stronger bonding between the coating film and the semiconductor element and between the coating film and the pedestal without using an adhesive agent or the like.

The semiconductor element may be provided with a coating member that covers at least a part of the external surface of the coating film, in order to protect the semiconductor element and the coating film.

The coating member may be permeable to light. Use of a translucent coating member enables it to improve the efficiency of extracting light emitted by the semiconductor light emitting element. Particularly by using the semiconductor light emitting element, the coating film and the coating member made of materials having refractive indices decreasing in this order, it is made possible to improve the efficiency of extracting light emitted by the semiconductor light emitting element.

The coating member is preferably made in semi-spherical shape or lens shape which makes it possible to control the directivity of light.

The coating member may include a fluorescent material, a pigment or a dispersant mixed therein. For example, by mixing a fluorescent material or a pigment in the coating member, such a semiconductor device can be provided that emits light of a predetermined color through transformation of wavelength of light emitted by the semiconductor light emitting element. When a dispersant is mixed in the coating member, for example, a semiconductor device having improved effect of diffusing light can be provided.

The coating member is preferably made of silicone resin composition or epoxy resin composition, since it is high in light permeability and in heat resistance.

The first manufacturing method according to the present invention is a method for manufacturing the semiconductor device that includes a pedestal and a semiconductor element placed on the pedestal, with at least a part of the top face and the side face of the semiconductor element and the top face of the pedestal being covered by a coating film, said method comprising a first process of successively placing at least the pedestal, the semiconductor element and the coating film one on another, a second process of putting the pedestal, the semiconductor element and the coating film that have been placed one on another in the first process into a bag, and a third process of reducing a pressure within the bag so that the coating film is fastened onto at least a part of the top face and the side face of the semiconductor element and the top face of the pedestal.

This constitution provides a method for easily manufacturing the semiconductor device wherein at least a part of the semiconductor element is covered. It is also made possible to provide a semiconductor device having the coating film of a predetermined thickness. Also a semiconductor device having less variability in color among products can be provided since the substantially uniform coating film can be provided on the top face and the side face of the semiconductor light emitting element, when the coating film having a fluorescent material mixed therein and the semiconductor light emitting element are used.

A second manufacturing method according to the present invention is a method for manufacturing a semiconductor device that includes a pedestal and a semiconductor element placed on the pedestal, with at least a part of the top face and side face of the semiconductor element and the top face of the pedestal being covered by a coating film, said method comprising a first process of successively placing at least the pedestal, the semiconductor element and the coating film one on another between a first film and a second film that are used in lamination process, a second process of laminating the first film and the second film on at least part thereof and bonded together in vacuum, and a third process of reducing a pressure within the space between the first film and the second film in vacuum so that the coating film is fastened onto at least a part of the top face and the side face of the semiconductor element and the top face of the pedestal.

This constitution enables it to form the coating film at a predetermined position of the semiconductor element without positional deviation between the semiconductor element and the coating film. Also a method can be provided for easily manufacturing the semiconductor device wherein at least a part of the semiconductor element is covered. It is also made possible to provide a semiconductor device having the coating film of a predetermined thickness. Also a semiconductor device having less variability in color among products can be provided since the substantially uniform coating film can be provided on the top face and the side face of the semiconductor light emitting element, when the coating film having a fluorescent material mixed therein and the semiconductor light emitting element are used.

In the first process, it is preferable to provide a back plate on a surface of the pedestal opposite to the surface thereof on which the semiconductor element is placed. Providing the back plate on the pedestal makes it possible to prevent the pedestal from warping and braking when the pressure in the bag is reduced, thereby improving the efficiency of production.

In the first process, it is preferable to mix a fluorescent material, a pigment or a dispersant in the coating film. For example, by using a semiconductor light emitting element and mixing a fluorescent material or a pigment in the coating film, such a semiconductor device can be provided that emits light of a predetermined color. This eliminates the need for providing a fluorescent material layer separately. When a dispersant is mixed in the coating film, for example, such a semiconductor device can be provided that emits light of a predetermined color through the transformation of the wavelength of light emitted by the semiconductor light emitting element. For example, a semiconductor device having improved effect of diffusing light can be provided by mixing a dispersant in the coating film.

In the first process, it is preferable that the coating film is made by using a silicone resin composition, since it is high in light permeability and allows for high productivity.

In the first process, the coating film may have adhesiveness, since it provides stronger bonding between the coating film and the semiconductor element and between the coating film and the pedestal without using an adhesive agent or the like.

In the first process, the coating film consists of one or more film. This constitution enables it to provide light emitting devices that emit light of various colors.

In the third process, a pressure may be applied to the bag from the outside. This further improves the bonding strength between the semiconductor element and the coating film.

In the third process, it is preferable to apply a pressure to the bag from the outside, and to use isotropic pressure pressing means as the means for applying the pressure. Use of the isotropic pressure pressing means enables it to form the coating film uniformly since there is no possibility of localized pressure being applied to a part of the coating film. It also becomes possible to prevent positional deviation from occurring between the semiconductor element and the coating film.

It is preferable to heat the inside of the bag in the third process or after the third process. This further improves the bonding strength between the semiconductor element and the coating film.

In the third process, a pressure may be applied to the first film and the second film from the outside. This further improves the bonding strength between the semiconductor element and the coating film.

In the third process, it is preferable that a pressure is applied to the first film and the second film from the outside, and the means of applying the pressure is isotropic pressure pressing means. Use of the isotropic pressure pressing means enables it to form the coating film uniformly since there is no possibility of localized pressure being applied to a part of the coating film. It also becomes possible to prevent positional deviation from occurring between the semiconductor element and the coating film.

It is preferable to heat the space between the first film and the second film in the third process or after the third process. This further improves the bonding strength between the semiconductor element and the coating film.

In the second manufacturing method according to the present invention, it is preferable that, after the third process, to include a process of removing the first film, a process of covering the top face of the semiconductor element that is covered by the coating film with a coating film of the same or different kind, between the third film and the second film or a fourth film which are used in lamination process, a process of laminating the third film and the second film or the fourth film are laminated on at least part thereof and bonded together in vacuum, and a process of reducing the pressure in the space between the third film and the second film or the fourth film in vacuum so that the top face of the semiconductor element that is covered by the coating film is bonded with a coating film of the same or different kind, thereby forming a coating film consisting of two or more films on at least portion of the top and side faces of the semiconductor element and the top face of the pedestal. This constitution enables it to provide light emitting devices that emit light of various colors.

DESCRIPTION OF THE PREFERRED EMBODIMENTS

Figure 1:
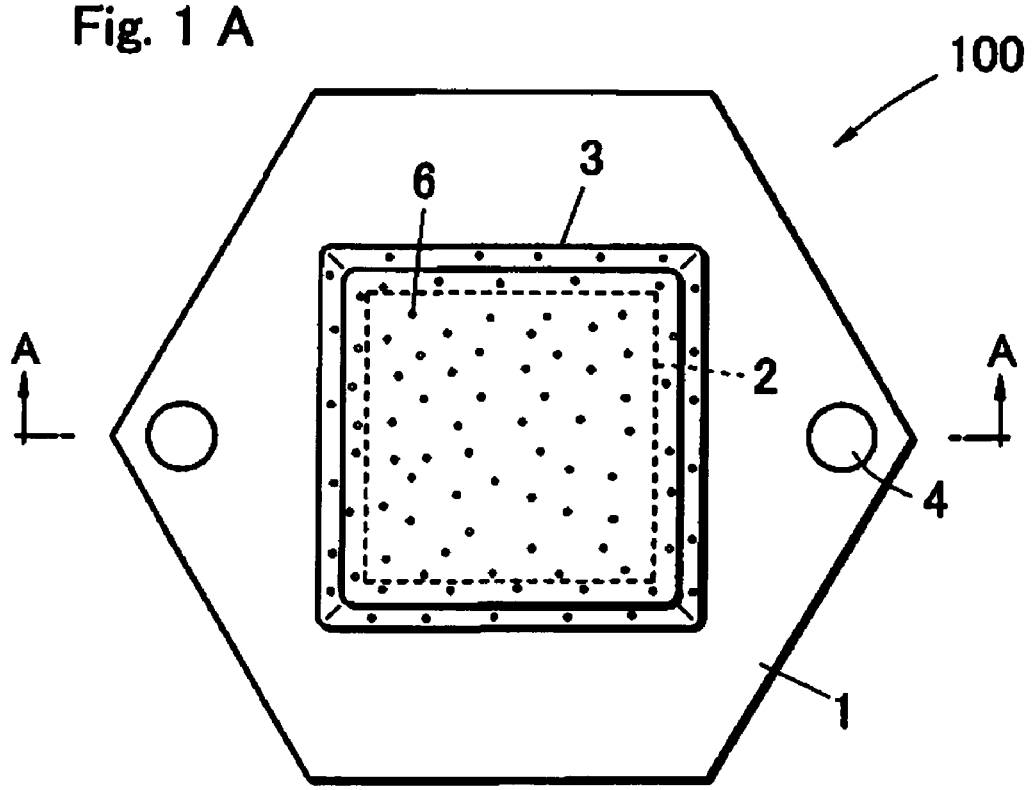
FIG. 1A is a schematic plan view showing the semiconductor device according to the first embodiment of the invention.
FIG. 1B is a schematic sectional view taken along lines A-A' in FIG. 1A.
Figure 1:
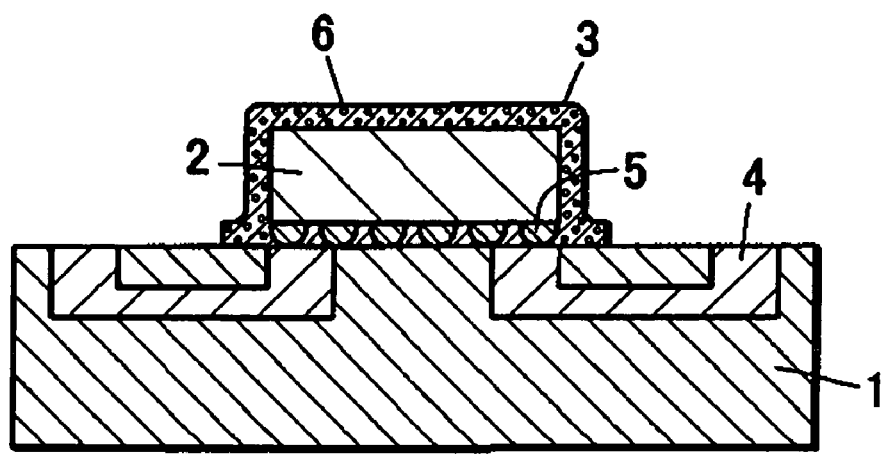

Now the semiconductor device and the method for manufacturing the same according to the present invention will be described below by way of embodiments and examples. It is understood, however, that the present invention is not limited by these embodiments and examples.

Embodiment 1

FIG. 1A is a schematic plan view showing the semiconductor device according to a first embodiment of the invention. FIG. 1B is a schematic sectional view taken along lines A-A' in FIG. 1A showing the semiconductor device according to the first embodiment. FIG. 2A is a schematic perspective view showing a coating film used in manufacturing the semiconductor device of the first embodiment. FIG. 2B is a part of schematic sectional view taken along lines B-B' in FIG. 2A showing the sectional structure of the coating film. FIG. 2C is a schematic sectional view of the semiconductor device of the first embodiment.

<Semiconductor Device>

A semiconductor device 100 of the first embodiment comprises a semiconductor light emitting element 2 placed on the top face of a pedestal 1, while a coating film 3 covers at least a part of the top face and the side face of the semiconductor light emitting element 2 and the top face of the pedestal 1. The pedestal 1 has electrode 4 formed thereon having a predetermined electrical conductivity pattern opposing the electrode pattern of the semiconductor light emitting element 2. The semiconductor light emitting element 2 is mounted face down on the top face of the pedestal 1. The semiconductor light emitting element 2 has positive and negative electrodes (not shown) that are electrically connected via a joint member 5 to the electrode 4 of the pedestal 1. Connection is made, for example, by forming solder bumps on the side of the electrode 4 and applying ultrasonic vibration while the semiconductor light emitting element 2 is placed on the solder bumps, thereby bonding the electrodes. Part of the electrode 4 is electrically connected with the electrode of the semiconductor light emitting element 2, and the other part thereof is electrically connected with external electrode (not shown) via a wire or the like to establish electrical continuity. An insulating under fill is inserted for the prevention of short-circuiting in a portion of the gap other than the joint member 5 between the electrode of the semiconductor light emitting element 2 and the electrode 4 of the pedestal 1. The coating film 3 contains a fluorescent material 6 that transforms the wavelength of light emitted by the semiconductor light emitting element 2 and emits light of wavelength different from that of light emitted by the semiconductor light emitting element 2.

The coating film 3 has a thickness of a portion thereof covering the top face of the semiconductor light emitting element 2 (first thickness), a thickness of a portion thereof covering the side face of the semiconductor light emitting element 2 (second thickness) and a thickness of a portion thereof covering the top face of the pedestal (third thickness), that are substantially equal to each other. The external surface of the coating film 3 located on the edge that is the intersect between the top face and the side face of the semiconductor light emitting element 2 has a rounded shape. The external surface of the coating film 3 located on the boundary (edge) between side face of the semiconductor light emitting element 2 and the top face of the pedestal 1 has a rounded shape. In this specification, the first thickness, the second thickness and the third thickness are the mean thickness of the respective portions.

The external surface of the coating film 3 that covers the semiconductor light emitting element 2 has protrusions and recesses due to the inclusion of the fluorescent material 6, while the protrusions and the recesses have gently sloped surfaces. Since the protrusions and the recesses increase the surface area of the external surface of the coating film 3, the efficiency of extracting light can be improved. The protrusions and recesses of the coating film 3 are caused because the silicone resin shrinks in volume while in contact with the semiconductor light emitting element 2, so that portions containing the fluorescent material 6 remain slightly protruded. The interface between the semiconductor light emitting element 2 and the coating film 3 is smooth. This enables it to increase the bonding strength between the coating film 3 and the semiconductor light emitting element 2, and improve the efficiency of extracting light through the coating film 3 and the semiconductor light emitting element 2.

<Semiconductor Element>

The semiconductor element may be used for, in addition to the semiconductor light emitting element that emits light, transistor and integrated circuit or large-scale integrated circuit such as IC, LSI, VLSI or ULSI. While a case of semiconductor light emitting element 2 is described in this specification as typical example, the present invention is not limited to this case.

<Semiconductor Light Emitting Element>

The semiconductor light emitting element 2 has such a constitution as an n-type semiconductor layer (not shown) and a p-type semiconductor layer (not shown) made mainly of nitride gallium are formed on a transparent member (not shown) such as sapphire substrate or silicon substrate, and is electrically connected via an n-type electrode (not shown) and a p-type electrode (not shown) to the electrode 4 provided on the pedestal 1. An insulating protective film (not shown)

made of silicon oxide, polyimide or a composite film thereof is formed to cover the semiconductor layer except for the region of the pad electrode. The pad electrode and the electrode 4 provided on the pedestal are connected with each other by the joint member 5. An insulating under fill is inserted in a portion other than the joint member 5 between the pad electrode and the electrode 4 provided on the pedestal 1 for the purpose of purging air and preventing short-circuiting between the p-type electrode and the n-type electrode. The joint member 5 may be solder or gold bump bonded by ultrasonic excitation between the electrically conductive pattern and the pad electrode, an electrically conductive paste such as gold, silver, palladium or rhodium, or an anisotropically conductive paste.

The semiconductor light emitting element 2 is preferably of flip-chip type.

The semiconductor light emitting element 2 may be, in addition to one that emits light in the visible region of wavelengths from 380 nm or 400 nm to 780 nm, one that emits ultraviolet ray of wavelengths from 350 nm or 380 nm to 400 nm.

The semiconductor light emitting element 2 is not limited to one that emits light of three primary colors; blue, green and red, but may also be to one that emits light of such colors as blue-purple, blue-green, yellow-green, yellow and orange. When the fluorescent material 6 is mixed in the coating film 3, it is preferable to use the semiconductor light emitting element 2 that emits light of wavelength that can excite the fluorescent material 6.

There is no restriction on the dimensions of the semiconductor light emitting element 2, which may be 1 mm square, 0.5 mm square, 2 mm square or measure 2 mm by 1 mm.

<Pedestal>

The pedestal 1 has the electrode 4 formed thereon having a pair of predetermined electrically conductive patterns of positive and negative polarities. The electrically conductive patterns of the electrode 4 have a portion that is electrically connected to the semiconductor light emitting element 2 and a portion that is electrically connected to an external electrode, both portions being connected with each other. It is preferable that only these portions are exposed on the surface of the pedestal 1, but portions of the electrically conductive pattern other than these portions may also be exposed. The portion of the electrically conductive patterns that is electrically connected to the semiconductor light emitting element 2 has such a shape as correspond to the p-type electrode and the n-type electrode of the semiconductor light emitting element 2. The portion electrically connected to the external electrode is connected by wire bonding using a wire. Thus the semiconductor light emitting element 2 is electrically connected to the external electrode via the electrically conductive pattern and the electrode 4.

The pedestal 1 may be a glass epoxy substrate, a liquid crystal polymer substrate, polyimide resin substrate, a ceramic substrate or the like.

The electrically conductive pattern may be made of a good electrical conductor such as copper, phosphor bronze, iron or nickel. The electrically conductive pattern may also be plated on the surface thereof with a noble metal such as silver, gold, palladium or rhodium.

<Coating Film>

The coating film 3 covers the top face and the side face of the semiconductor light emitting element 2 and the top face of the pedestal 1. The coating film 3 may also cover only the top face and the side face of the semiconductor light emitting element 2.

The coating film 3 has such a configuration as a portion thereof that covers the top face of the semiconductor light emitting element 2, a portion thereof that covers the side face of the semiconductor light emitting element 2 and a portion thereof that covers the top face of the pedestal 1 are substantially equal to each other in thickness. The external surface of the coating film 3 located on the edge that is the intersect between the top face and the side face of the semiconductor light emitting element 2 has a rounded shape. The external surface of the coating film 3 located on the edge that is the boundary (intersect) between the side face of the semiconductor light emitting element 2 and the top face of the pedestal 1 has a rounded shape. The rounded shape of the coating film 3 is formed when the thin sheet (coating film) is fastened onto the surface of the semiconductor light emitting element 2 during the manufacturing process.

In the semiconductor device, thickness of the coating film 3 is preferably in the following ranges: (1) the difference between the maximum value and the minimum value of thickness of the coating film in a portion thereof that covers the top face of the semiconductor light emitting element 2 is within $1/10$ of the arithmetic mean of the thicknesses (first thickness) of the coating film; (2) the difference between the maximum value and the minimum value of thickness of the coating film in the portion that covers the side face of said semiconductor light emitting element 2 is within $1/10$ of the arithmetic mean of the thicknesses (second thickness) of the coating film; (3) the difference between the maximum value and the minimum value of thickness of the coating film in a portion that covers the top face of said pedestal 3 is within $1/10$ of the arithmetic mean of the thicknesses (third thickness) of the coating film; and (4) at least two of the first thickness that is represented by the arithmetic mean of the thicknesses of coating film in a portion thereof covering the top face of the semiconductor light emitting element 2, the second thickness that is represented by the arithmetic mean of the thicknesses of the coating film in a portion thereof covering the side face of the semiconductor light emitting element 2 and the third thickness that is represented by the arithmetic mean of the thicknesses of the coating film in a portion thereof covering the top face of the pedestal 1 are substantially equal to each other. The phrase that two thicknesses are substantially equal means that, for example, the difference between the first thickness and the second thickness is within $1/5$ of any one of the first thicknesses and the second thickness. The external surface of the coating film 3 located on the edge that is the intersect between the top face and the side face of the semiconductor light emitting element 2 has a rounded shape, and the rounded shape is an arc having a radius of curvature of the external surface in a range from $(1/2)N$ to $3M$, where M is the larger one of first distance and second distance, and N is the smaller distance. The external surface of the coating film 3 located on the edge that is the intersect between the side face of the semiconductor light emitting element 2 and the top face of the pedestal 1 has a rounded shape, and the rounded shape is an arc having radius of curvature of the external surface in a range from $(1/2)T$ to $3S$, where S is the larger one of second distance and third distance, and T is the smaller distance.

While it is preferable to form the coating film 3 from silicone resin composition or denatured silicone resin composition, insulating resin compositions that are permeable to light may be used such as epoxy resin composition, denatured epoxy resin composition or acrylic resin composition.

The coating film 3 contains the fluorescent material 6 mixed therein. The fluorescent material 6 is preferably mixed in substantially uniform proportion in the coating film 3. But the fluorescent material 6 may also be mixed substantially uniformly in higher proportion on the side of one surface of the coating film 3. By placing the surface where the fluorescent material 6 is mixed in lower proportion on the side of the semiconductor light emitting element 2, deterioration of the fluorescent material 6 can be suppressed since it becomes difficult for the heat generated by the semiconductor light emitting element 2 to transmit toward the fluorescent material 6.

The coating film 3 may also include a pigment or a dispersant mixed therein, since it enables it to form the coating film 3 appropriate for the application.

The coating film 3 is preferably a soft film, so as to fit closely on the top face and the side face of the semiconductor light emitting element 2 and the top face of the pedestal 1, thus conforming to the configuration of the semiconductor light emitting element 2.

The coating film 3 preferably has adhesiveness. Making the costing film 3 adhesive enables it to increase the bonding strength between the semiconductor light emitting element 2 and the coating film 3. Adhesiveness may be demonstrated not only at the normal temperature but also through application of heat and pressure to the coating film 3.

Thickness of the coating film 3 is preferably roughly in a range from 10 to 150 μm, and more preferably in a range from 25 to 100 μm for the ease of operation. However, there is no restriction on the thickness, and various thicknesses from very thin film to thick film can be used.

The coating film 3 may shrink in volume as alcohol and/or other component of the coating film 3 evaporates when temperature or pressure is applied for drying. This causes protrusions and recesses to appear on the external surface of the coating film 3. Some of the protrusions on the external surface of the coating film 3 are caused by the particles of the fluorescent material 6. As the protrusions are formed on the external surface of the coating film 3, light emitted by the semiconductor light emitting element 2 can be extracted efficiently to the outside.

<Fluorescent Material>

The fluorescent material 6 absorbs light emitted by the semiconductor light emitting element 2, and emits light of wavelength different from that of the semiconductor light emitting element 2. Thus the semiconductor device 100 that produces light emitted by the fluorescent material 6 can be provided. For example, the semiconductor light emitting element 2 that emits ultraviolet ray having peak wavelength around 360 nm is used to excite oxynitride-based fluorescent material 6 activated with europium. The oxynitride-based fluorescent material 6 emits green light. Thus the semiconductor device 100 that produces light emitted by the fluorescent material 6 can be provided.

Light emitted by the semiconductor light emitting element 2 and light emitted by the fluorescent material 6 may also be blended so as to provide the semiconductor device 100 that emits light of a predetermined color. For example, the semiconductor light emitting element 2 that emits blue light having peak wavelength around 460 nm is used to excite rare earth aluminate fluorescent material 6 activated with cerium. The rare earth aluminate fluorescent material 6 emits yellow light. Thus semiconductor device that emits white light can be provided by blending the blue light emitted by the semiconductor light emitting element 2 and the yellow light emitted by the rare earth aluminate fluorescent material 6.

The fluorescent material 6 is preferably at least one selected from among alkaline earth halogen apatite fluorescent materials, alkaline earth halogen apatite fluorescent materials, alkaline earth metal boric acid halogen fluorescent materials, alkaline earth metal aluminate fluorescent materials, alkaline earth silicates, alkaline earth sulfides, alkaline earth thiogallates, alkaline earth silicon nitrides, germanates, nitrates and oxynitraides, that are mainly activated with elements based on lanthanoid such as Eu or elements based on transition metals such as Mn; rare earth aluminates that are mainly activated with elements based on lanthanoid such as Ce; and organic complexes that are mainly activated with elements based on lanthanoid such as Eu. Specific examples of the fluorescent material include, but are not limited to, the following fluorescent materials.

Examples of the alkaline earth halogen apatite fluorescent material, that is mainly activated with elements based on lanthanoid such as Eu or elements based on transition metals such as Mn, include $M_5(PO_4)_3X:R$ (M is at least one element selected from among Sr, Ca, Ba, Mg and Zn, X is at least one element selected from among F, Cl, Br and I, and R is Eu and/or Mn).

Examples of the alkaline earth metal aluminate fluorescent material include $SrAl_2O_4:R$, $Sr_4Al_{14}O_{25}:R$, $CaAl_2O_4:R$, $BaMg_2Al_{16}O_{27}:R$, $BaMg_2Al_{16}O_{12}:R$ and $BaMgAl_{10}O_{17}:R$ (R is Eu and/or Mn).

Examples of the alkaline earth sulfide fluorescent material include $La_2O_2S:Eu$, $Y_2O_2S:Eu$ and $Gd_2O_2S:Eu$.

Examples of the rare earth aluminate fluorescent material, that is mainly activated with elements based on lanthanoid such as Ce, include fluorescent materials represented by the following composition formulas $Y_3Al_5O_{12}:Ce$, $(Y_{0.8}Gd_{0.2})_3Al_5O_{12}:Ce$, $Y_3(Al_{0.8}Ga_{0.2})_5O_{12}:Ce$ and $(Y,Gd)_3(Al,Ga)_5O_{12}$.

Examples of the oxynitride fluorescent material, that is mainly activated with elements based on lanthanoid such as Eu, include fluorescent materials represented by the following composition formula $MSi_2O_2N_2:Eu$ (M has at least one element of the group II elements such as Ba, Ca, Sr and Mg).

Examples of the nitride fluorescent material, that is mainly activated with elements based on lanthanoid such as Eu, include fluorescent materials represented by the following composition formula $M_2Si_5N:Eu$ (M has at least one element of the group II elements such as Ba, Ca, Sr and Mg).

<Method of Manufacturing the Semiconductor Device According to the First Embodiment>

Figure 9:
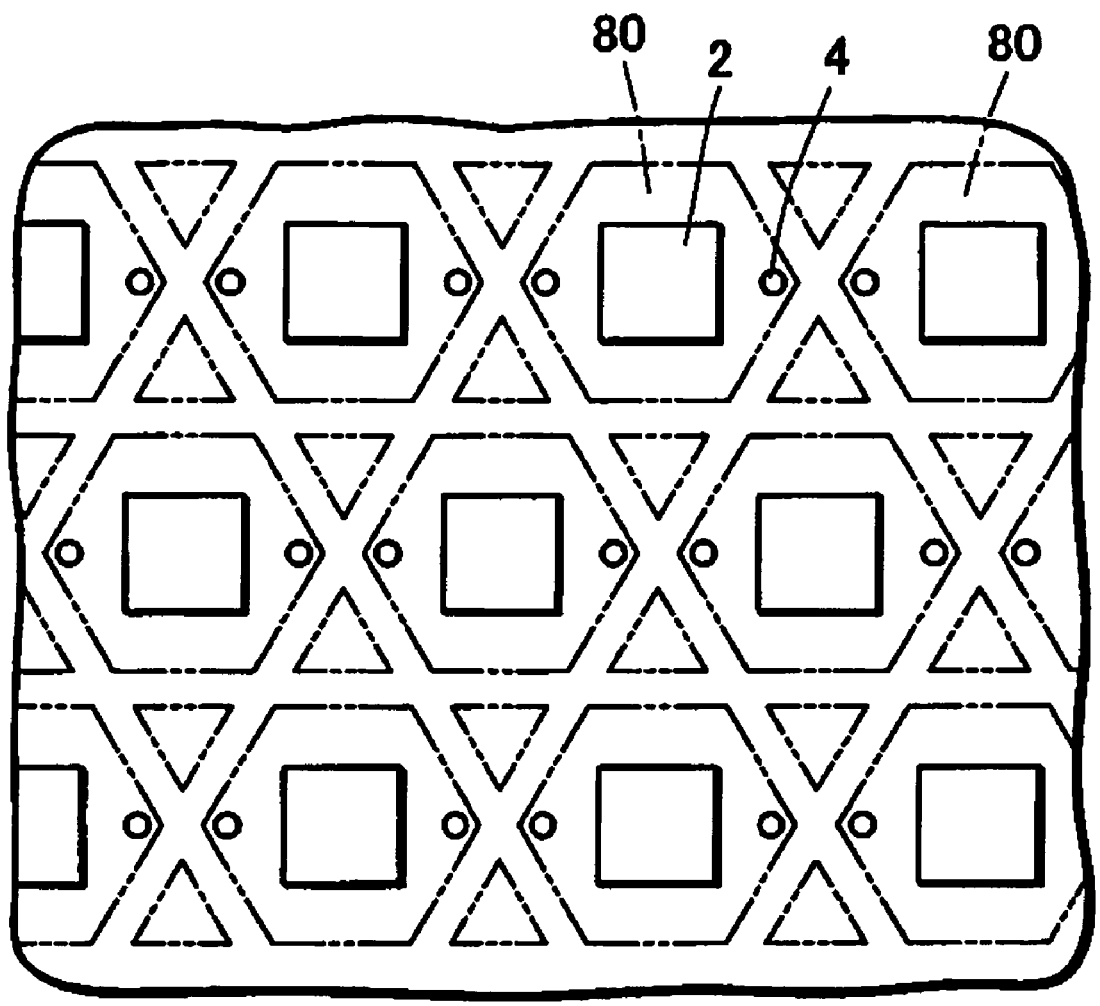
FIG. 9 is a schematic plan view showing the semiconductor light emitting element disposed on the top face of the pedestal that is not yet cut, before the coating film is formed in the manufacturing method of the first embodiment.

The method of manufacturing semiconductor device 100 according to the first embodiment will now be described. A typical example of the manufacturing method is described where a plurality of semiconductor light emitting elements 2 are mounted on a single plate-like pedestal 80 that is not yet divided, before the coating film is formed, but the present invention is not limited to this constitution. FIG. 9 is a schematic plan view showing the semiconductor light emitting element 2 disposed on the top face of the pedestal 80 that is not yet cut, before the coating film is formed. FIG. 11A through FIG. 11G are a sectional view schematically showing a process of the film forming method according to the present invention.

1. In this method, a back plate 7, the pedestal 80, the semiconductor light emitting element 2 and the coating film 3 are placed one on another in this order from the bottom between the first film 8 and the second film 9 that are to be laminated (first process, refer to FIG. 11A). This process is carried out in the following procedure. The coating film 3 has the fluorescent material 6 mixed therein beforehand.

(1) A plurality of the semiconductor light emitting elements 2 are mounted face down at predetermined positions on the top face of the pedestal 80 in advance. There is no restriction on the method of this mounting process, and known mounting method can be employed. As shown in FIG. 9, the pedestal 1 that has been divided has hexagonal shape and has the semiconductor light emitting element 2 placed at the center of the pedestal 1. The figure shows the semiconductor light emitting element 2 having rectangular shape placed so that two sides thereof are disposed parallel to two opposing parallel sides of the hexagonal shape of the pedestal 1. As described above, the pedestal 80 before the coating film 3 is formed thereon has a plate shape with a plurality of semiconductor light emitting elements 2 disposed thereon.

(2) Then the back plate 7 is provided on the bottom face of the pedestal 80 having a plurality of semiconductor light emitting elements 2 disposed thereon. The back plate 7 is provided in order to prevent the pedestal 80 from warping and braking during the lamination process. The back plate 7 preferably has a size comparable to the size of the pedestal 80 or a little larger than the pedestal 80.

(3) Then the coating film 3 is placed on the pedestal 80 whereon the semiconductor light emitting elements are disposed. The coating film 3 preferably has a size comparable to the size of the pedestal 80.

This process is carried out in nitrogen atmosphere. This process is preferably carried out in an inert gas atmosphere such as nitrogen atmosphere or argon atmosphere. It may also be carried out in vacuum.

The first film 8 and the second film 9 that are to be laminated may be made of polypropylene, polyethylene or polyethylene terephthalate. The first film 8 may be softer or thinner than the second film 9.

2. Then the first film 8 and the second film 9 are laminated in vacuum so as to bond with each other (second process, refer to FIG. 11B). This process is carried out in the following procedure.

(1) With the semiconductor device having the back plate 7, the pedestal 80, the semiconductor light emitting element 2 and the coating film 3 placed one on another thereon in this order being inserted between the first film 8 and the second film 9, the atmosphere is switched from nitrogen to vacuum.

(2) The first film 8 and the second film 9 are bonded on the periphery thereof by thermal fusing or the like, but an evacuation hole is left so that the space between the laminated films can be evacuated in the third process.

3. The coating film 3 is bonded on the top face and the side face of the semiconductor light emitting element 2 and the top face of the pedestal 1, while evacuating the space between the first film 8 and the second film 9 in vacuum (third process, refer to FIG. 11BC).

By evacuating the space between the laminated films in vacuum, gap between the coating film 3 and the pedestal 1 is substantially eliminated. The gap between the semiconductor light emitting element 2 and the pedestal 1 is evacuated vacuum. Thus the coating film 3 is contacted closely on the top face and the side face of the semiconductor light emitting element 2 and the top face of the pedestal 1.

In the third process, it is preferable to apply a pressure to the first film 8 and the second film 9 from the outside, in order to improve the close contact between the coating film 3 and the semiconductor light emitting element 2 and the close contact between the pedestal 1 and the semiconductor light emitting element 2. However, the pressure is controlled to a predetermined level because applying an excessively high pressure may cause the coating film 3 to rupture or the bumps that connect the semiconductor light emitting element 2 and the pedestal 1 to break. The pressure is preferably in a range from 5 to 50 kgf/cm$^2$. The isotropic pressure pressing means is preferably used to apply the pressure to the first film 8 and the second film 9 from the outside. As the isotropic pressure pressing means, immersion of the laminated films in water or rubber may be employed.

In the third process, or after the third process, it is preferable to heat the space between the first film 8 and the second film 9. Close contact between the coating film 3 and the semiconductor light emitting element 2 and the close contact between the pedestal 1 and the semiconductor light emitting element 2 can be improved by heating. It is preferable to heat to such a temperature as the coating film 3 becomes adhesive or soften. The temperature is preferably such as the first film 8 and the second film 9 can endure, and the coating film 3 shows adhesiveness, for example from 100 to 170° C.

4. Then the first film 8 and the second film 9 are removed from the semiconductor device on which the coating film 3 has been fastened (fourth process, refer to FIG. 1D). After fastening the coating film 3 onto the semiconductor light emitting element 2 and the pedestal 1, the first film 8 and the second film 9 are carefully removed so as not to break the coating film 3. Such a procedure may also be employed as the coating film 3 is tentatively hardened in the third process, then the first film 8 and the second film 9 are removed in the fourth process and the coating film 3 is fully hardened.

5. Then the coating film 3 is trimmed (fifth process, refer to FIG. 11E). After fastening the coating film 3 onto the semiconductor light emitting element 2 and the pedestal 80, unnecessary portion is cut off with a cutting tool 10 such as a sharp-edged cutter. Alternatively, a die having a predetermined shape is pressed against the pedestal 1 at a predetermined position, the unnecessary portion is sucked off.

6. Then the pedestal 80 is diced (sixth process, refer to FIG. 11F). After dicing, the semiconductor device is removed from the back plate 7. A dicing saw 11 is used to dice the semiconductor device into a predetermined shape. Dicing may be done by either cutting through the pedestal 80 from the top face to the bottom face using the dicing saw 11, or partially cutting the pedestal 80 from the top face to a mid point and then cleaving the pedestal 80 by applying a force.

The semiconductor device of the first embodiment can be manufactured in the process described above (refer to FIG. 11G).

In an alternative manufacturing method, a bag may be used instead of the laminated films. The bag has a predetermined size and shape that can accommodate the back plate 7, the pedestal 80, the semiconductor light emitting element 2 and the coating film 3, and may be made of polypropylene, polyethylene or polyethylene terephthalate. Use of the bag enables it to eliminate the process of laminating the films around the pedestal 80.

Such an alternative manufacturing method may also be employed as follows. For example, the pedestal 80 may be diced before the first film 8 and the second film 9 are removed after the third process. Then the first film 8 and the second film 9 are removed from the coating film 3 and the pedestal 1. The semiconductor device can be manufactured also in this way. Then after the first film 8 and the second film 9 are removed from the coating film 3 and the pedestal 1, the coating film 3 may be trimmed.

In another alternative manufacturing method, the pedestal 80 with the semiconductor light emitting element 2 mounted thereon that is cut in advance may also be arranged on the top face of the back plate 7. In this case, the coating film 3 is trimmed after completing the first through third processes. Then the first film 8 and the second film 9 are removed from the coating film 3. This enables it to omit the operation of dicing the pedestal 1 after forming the coating film 3, thereby preventing the coating film 3 from being broken in the dicing process.

The semiconductor device of the first embodiment can be manufactured also in the process described above.

Embodiment 2

Figure 3:
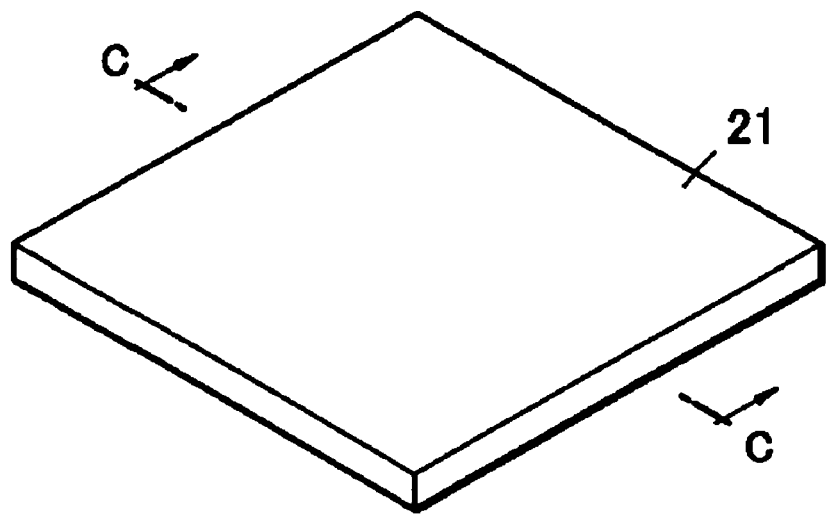
FIG. 3A is a schematic perspective view showing the coating film according to the second embodiment of the present invention.
FIG. 3B is a schematic sectional view taken along lines C-C' in FIG. 3A.
FIG. 3C is a schematic sectional view showing the semiconductor device according to the second embodiment.
Figure 3:
Figure 3:
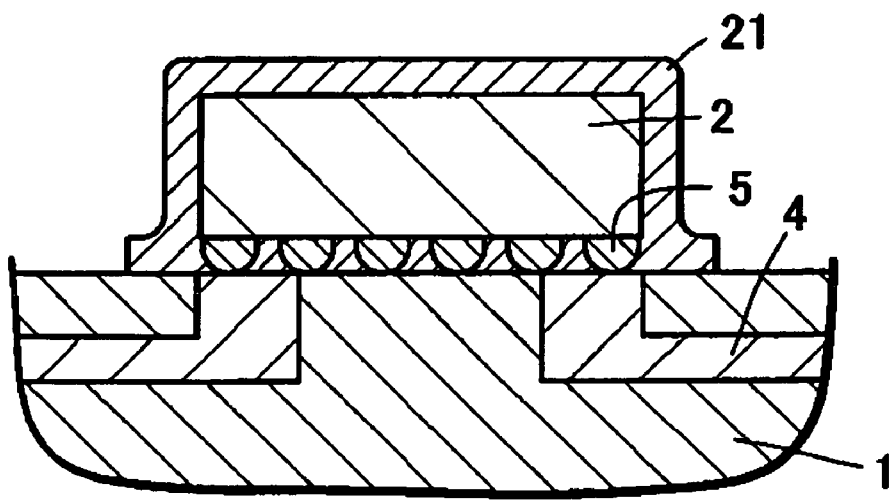

The semiconductor device according to second embodiment of the present invention will be described with reference to the accompanying drawings. FIG. 3A is a schematic perspective view showing a coating film 21 used when making the semiconductor device according to the second embodiment. FIG. 3B is a schematic sectional view of the coating film 21 taken along lines C-C' in FIG. 3A. FIG. 3C is a schematic sectional view showing the semiconductor device according to the second embodiment. This embodiment is similar to the first embodiment except for a different constitution of the coating film 21 that covers the semiconductor light emitting element 2. In the description of the second embodiment that follows, description on the shape of the semiconductor light emitting element 2 and other features that are similar to those of the first embodiment will be omitted.

In the second embodiment, the coating film 21 is made of a silicone resin that does not include fluorescent material 6. The coating film 21 is a thin film of a predetermined thickness without protrusions nor recesses before being fastened onto the semiconductor light emitting element 2. The coating film 21 has such a size that covers the pedestal 80 whereon the semiconductor light emitting element 2 is placed.

The coating film 21 covers the top face and side face of the semiconductor light emitting element 2 and the top face of the pedestal 1. After covering the semiconductor light emitting element 2 with the coating film 21 on the pedestal 80, the coating film is trimmed so as to remove unnecessary portion of the coating film from the top face of the pedestal 1.

As a result, the interface between the semiconductor light emitting element 2 and air is eliminated, so that light emitted by the semiconductor light emitting element 2 is transmitted through the coating film 21 that has a refractive index lower than that of the semiconductor light emitting element 2, to the air having further lower refractive index. This further improves the efficiency of extracting light from the semiconductor light emitting element 2.

Embodiment 3

Figure 4:
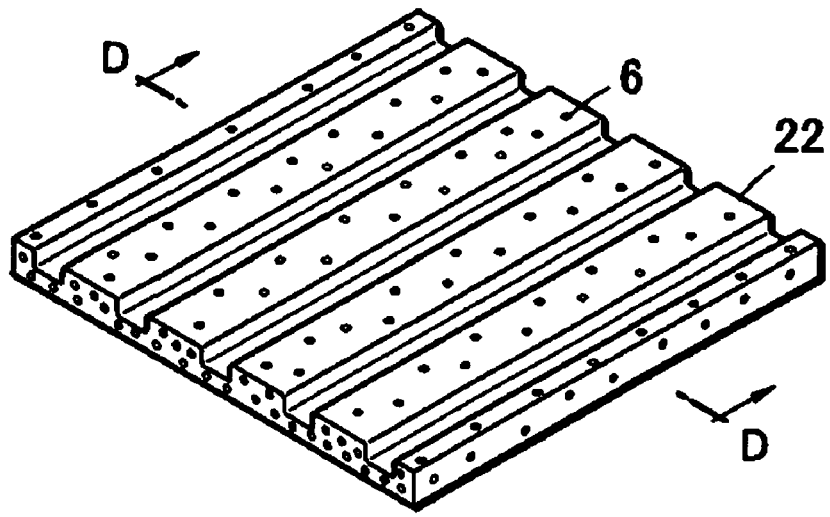
FIG. 4A is a schematic perspective view showing the coating film according to the third embodiment.
FIG. 4B is a schematic sectional view of the coating film taken along lines D-D' in FIG. 4A.
FIG. 4C is a schematic sectional view showing the semiconductor device according to the third embodiment of the present invention.
Figure 4:
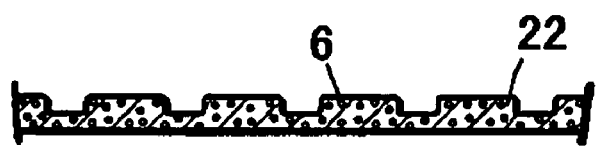
Figure 4:
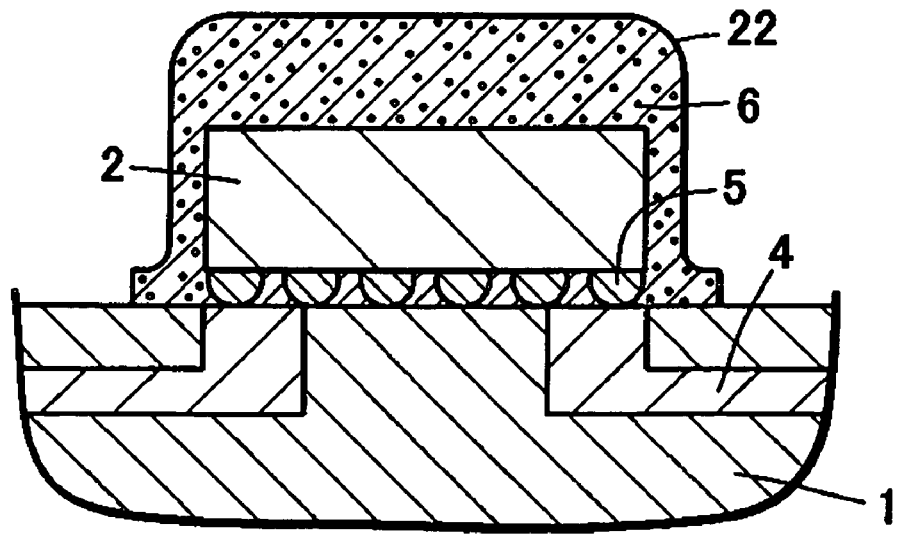

The semiconductor device according to third embodiment of the present invention will be described with reference to the accompanying drawings. FIG. 4A is a schematic perspective view showing a coating film 22 used when making the semiconductor device according to the third embodiment. FIG. 4B is a schematic sectional view of the coating film 22 taken along lines D-D' in FIG. 4A. FIG. 4C is a schematic sectional view showing the semiconductor device according to the third embodiment. This embodiment is similar to the first embodiment except for a different shape of the coating film 22 before being fastened onto the semiconductor light emitting element 2. In the description of the third embodiment that follows, description on the shape of the semiconductor light emitting element 2 and other features that are similar to those of the first embodiment will be omitted.

In the third embodiment, one surface of the coating film 22 before covering the semiconductor light emitting element 2 has stripes of protrusions and recesses. The coating film 22 is made of silicone resin. The fluorescent material 6 is mixed uniformly in the silicone resin of the coating film 22. Since the coating film 22 is thicker in the portions of the stripes of protrusion thereof than in the portions of the stripes of recess, there exists a larger amount of the fluorescent material 6 in the portions of the stripes of protrusion. The stripe of protrusion of the coating film 22 has a width substantially equal to the distance of the top face of the semiconductor light emitting element 2. The stripe of recess of the coating film 22 has a width (distance between adjacent protrusions) that is equal to the sum of a distance (spacing) between adjacent semiconductor light emitting elements 2, the vertical length of the side face of one semiconductor light emitting element 2 of the adjacent semiconductor light emitting elements 2, and the vertical length of the side face of the other semiconductor light emitting element 2 of the adjacent semiconductor light emitting elements 2. Since the silicone resin shrinks in volume when heated to harden, however, widths of the protrusions and recesses may be set larger so as to compensate for the shrinkage. The fluorescent material may also be included in such a concentration distribution as the fluorescent material 6 is included in the protrusion with higher concentration. The coating film 22 having the striped pattern of protrusions and recesses can be formed by pressing with a die having a predetermined configuration. It may also be formed by extrusion forming, drawing, rolling or the like.

The other surface of the coating film 22 (bottom surface opposing the semiconductor light emitting element 2 and the top face of the pedestal) is flat.

The coating film 22 having the constitution described above is placed so that the stripes of protrusions of the coating film 22 are located on top of the semiconductor light emitting element 2 that are disposed in an arrangement. That is, the stripes of protrusions of the coating film 22 are formed so as to correspond to the respective rows of the arrangement of the semiconductor light emitting element 2. When the coating film 22 is placed so that the protrusions are located on the top faces of the semiconductor light emitting element 2, the recesses of the coating film 22 are located on the side face of the semiconductor light emitting element 2 and the top face of the pedestal 1. In the semiconductor device manufactured in such a process as described above, larger amount of the fluorescent material exists on the top face of the semiconductor light emitting element 2 that is covered by the protrusion of the coating film 22, and therefore greater amount of light of wavelength transformed by the fluorescent material 6 is emitted. Through the side face of the semiconductor light emitting element 2 that correspond to the recess of the coating film 22, in contrast, greater amount of light from the semiconductor light emitting element 2 is emitted. Thus such a semiconductor device can be provided that easily emits blended light of the fluorescent material 6 and the semiconductor light emitting element 2. Efficiency of extracting light can also be improved. After covering the semiconductor light emitting element 2 with the coating film 22, the coating film is trimmed so as to remove unnecessary portion of the coating film from the top face of the pedestal 1.

Embodiment 4

Figure 5:
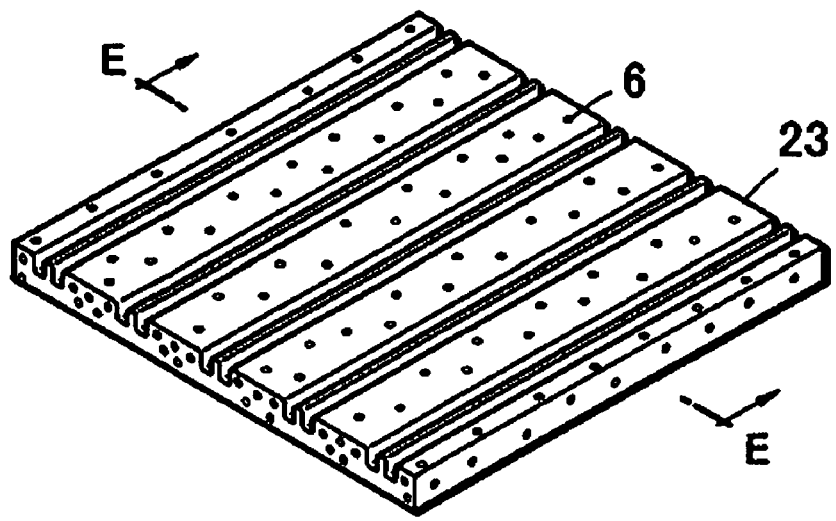
FIG. 5A is a schematic perspective view showing the coating film according to the fourth embodiment of the present invention.
FIG. 5B is a schematic sectional view of the coating film taken along lines E-E' in FIG. 5A.
FIG. 5C is a schematic sectional view showing the semiconductor device according to the fourth embodiment of the present invention.
Figure 5:
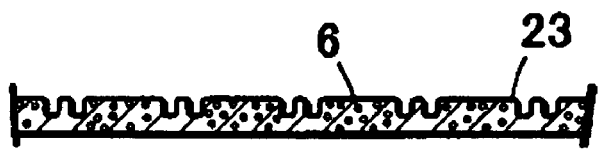
Figure 5:
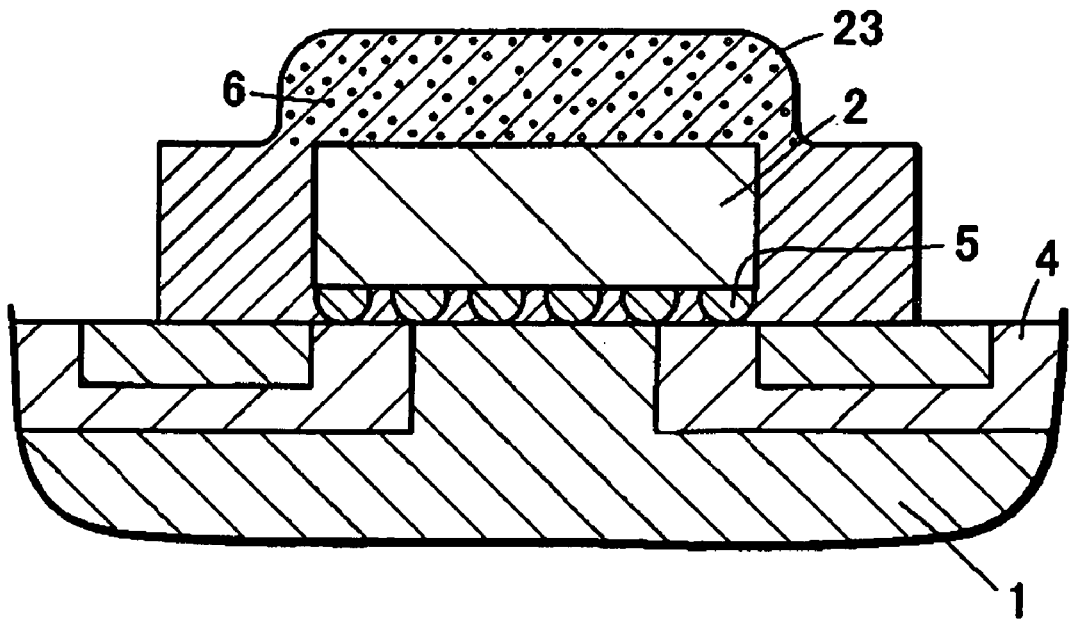

The semiconductor device according to fourth embodiment of the present invention will be described with reference to the accompanying-drawings. FIG. 5A is a schematic perspective view showing a coating film 23 used when making the semiconductor device according to the fourth embodiment. FIG. 5B is a schematic sectional view of the coating film 23 taken along lines E-E' in FIG. 5A. FIG. 5C is a schematic sectional view showing the constitution of the semiconductor device according to the fourth embodiment. The fourth embodiment is similar to the first embodiment except for a different shape of the coating film 23 before being fastened onto the semiconductor light emitting element 2. In the description that follows, description on the shape of the semiconductor light emitting element 2 and other features that are similar to those of the first embodiment will be omitted.

The coating film 23 has stripes of protrusions and recesses on one surface thereof. The coating film 23 is made of silicone resin. The fluorescent material 6 is mixed uniformly in the silicone resin of the coating film 23. Since the coating film 23 is thicker in the portions of the stripes of protrusion thereof than in the portions of the stripes of recess, there exists a larger amount of the fluorescent material 6 in the portions of the stripes of protrusion. The coating film 23 has two types of protrusions of different widths formed alternately on one surface thereof. The stripe of protrusion of one of the two types (first protrusion) has a width equal to the distance of the top face of the semiconductor light emitting element 2. The stripe of protrusion of the other type (second protrusion) has a width that is equal to the distance between adjacent semiconductor light emitting elements 2. Since the silicone resin shrinks in volume when heated to harden, however, widths of the protrusions and recesses may be set larger so as to compensate for the shrinkage. The coating film 23 having the striped pattern of protrusions and recesses can be formed by pressing with a die having a predetermined configuration. It may also be formed by extrusion forming, drawing or the like.

The bottom surface (the other surface) of the coating film 23 is flat.

The coating film 23 having the constitution described above is placed so that the first protrusion of one of the stripes the coating film 23 is located on top face of the semiconductor light emitting element 2 that are disposed in an arrangement. Recess is located on the edge of the top face and the side face of the semiconductor light emitting element 2, and the second protrusion of the other stripe of the coating film 22 is located on the side face of the semiconductor light emitting element 2 and the top face of the pedestal 80. Since larger amount of the fluorescent material exists on the top face of the semiconductor light emitting element 2 that is covered by the first protrusion of the coating film 22, greater amount of light from the fluorescent material 6 is emitted. Through the side face of the semiconductor light emitting element 2 that correspond to the second protrusion of the coating film 22, in contrast, greater amount of light from the semiconductor light emitting element 2 is emitted. Thus such a semiconductor device can be provided that readily emits blended light of the fluorescent material 6 and the semiconductor light emitting element 2. Efficiency of extracting light can also be improved. After covering the semiconductor light emitting element 2 with the coating film 22, the coating film is trimmed so as to remove unnecessary portion of the coating film from the top face of the pedestal 1.

Embodiment 5

Figure 6:
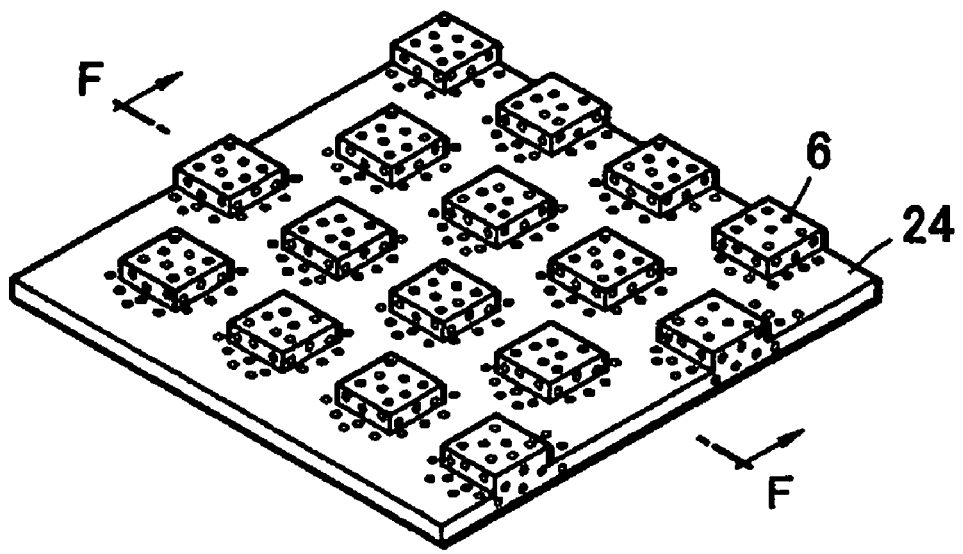
FIG. 6A is a schematic perspective view showing the coating film used according to the fifth embodiment of the present invention.
FIG. 6B is a schematic sectional view of the coating film taken along lines F-F' in FIG. 6A.
FIG. 6C is a schematic sectional view showing the semiconductor device according to the fifth embodiment of the present invention.
Figure 6:
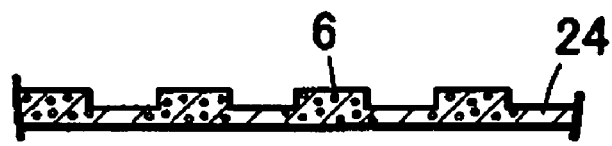
Figure 6:
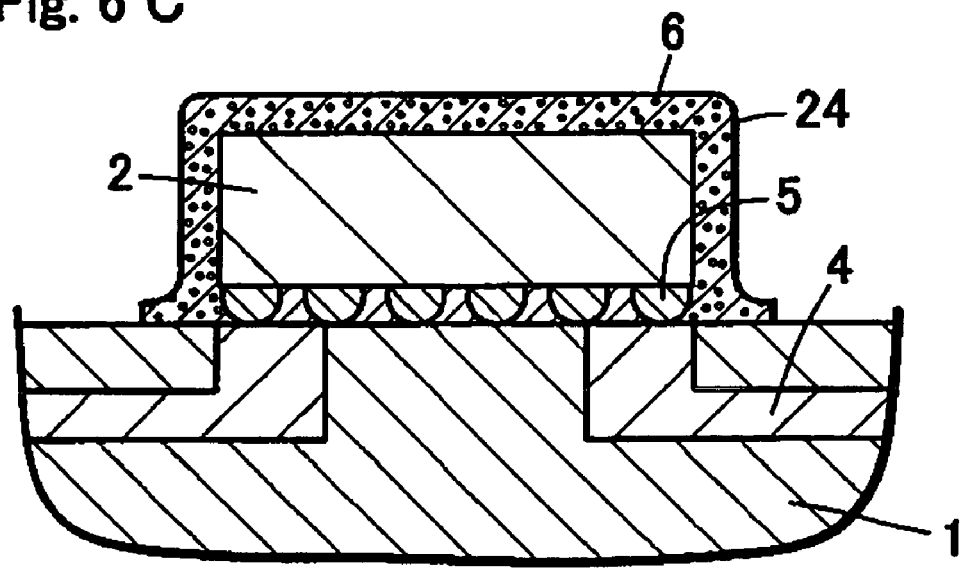

The semiconductor device according to fifth embodiment of the present invention will be described with reference to the accompanying drawings. FIG. 6A is a schematic perspective view showing a coating film used when making the semiconductor device according to the fifth embodiment. FIG. 6B is a schematic sectional view of the coating film taken along lines F-F' in FIG. 6A. FIG. 6C is a schematic sectional view showing the semiconductor device according to the fifth embodiment. The fifth embodiment is similar to the first embodiment except for a different shape of the coating film 24 before being fastened onto the semiconductor light emitting element 2. In the description that follows, description on the shape of the semiconductor light emitting element 2 and other features that are similar to those of the first embodiment will be omitted.

In the fifth embodiment, the coating film 24 has protrusions formed on one surface thereof so as to correspond to the semiconductor light emitting element 2. The coating film 24 is made of denatured silicone resin. The fluorescent material 6 and a dispersant are mixed uniformly in the denatured silicone resin of the coating film 24. Since the coating film 24 is thicker in the portions of the protrusion thereof than in the portions of the recess, there exists a larger amount of the fluorescent material 6 and the dispersant in the portions of the protrusion. The protrusion of the coating film 24 has a size corresponding to the top face and the side face of the semiconductor light emitting element 2. The protrusion of the coating film 24 is located at a position that corresponds to the portion where the semiconductor light emitting element 2 is disposed. Since the denatured silicone resin shrinks in volume when heated to harden, however, the protrusions of the coating film 24 may be formed a little wider. Waste of the fluorescent material 6 caused by trimming can be reduced by containing larger amount of the fluorescent material 6 in the protrusion of the coating film 24 and containing smaller amount of the fluorescent material 6 in the recess of the coating film 24. Protrusions and recesses of the coating film 24 can be formed by pressing with a die having a predetermined configuration. It may also be formed by extrusion forming, drawing or the like.

The bottom surface (the other surface) of the coating film 24 is flat.

The coating film 24 is placed so that the protrusion of the coating film 24 is located on top face and the side face of the semiconductor light emitting element 2 and the recess of the coating film 24 is located on the top face of the pedestal 80. In the semiconductor device of the fifth embodiment made as described above, since larger amount of the fluorescent material 6 exists on the top face and the side face of the semiconductor light emitting element 2 corresponding to the protrusion of the coating film 24, greater amount of light from the fluorescent material 6 is emitted. Since thickness of the coating film 24 is substantially equal on the top face and the side face of the semiconductor light emitting element 2, the semiconductor device having less color unevenness can be provided.

The coating film 24 may be a thin film without protrusions nor recesses, with a larger amount of the fluorescent material 6 included in the portions that corresponding to the shape of the semiconductor light emitting element 2. This makes it possible to manufacture the coating film 24 more easily.

Embodiment 6

Figure 7:
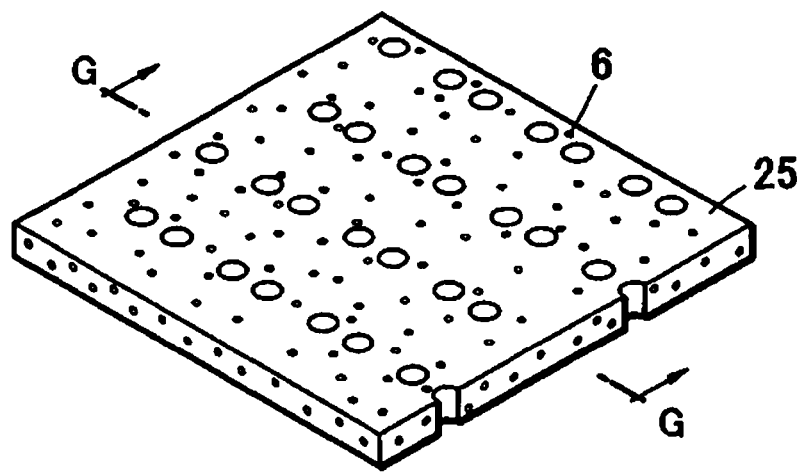
FIG. 7A is a schematic perspective view showing the coating film according to the sixth embodiment of the present invention.
FIG. 7B is a schematic sectional view of the coating film in a section taken along lines G-G in FIG. 7A.
FIG. 7C is a schematic sectional view showing the semiconductor device according to the sixth embodiment of the present invention.
Figure 7:
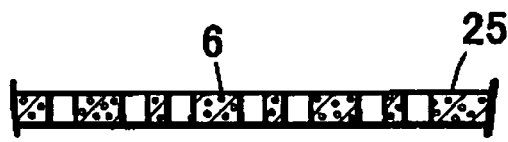
Figure 7:
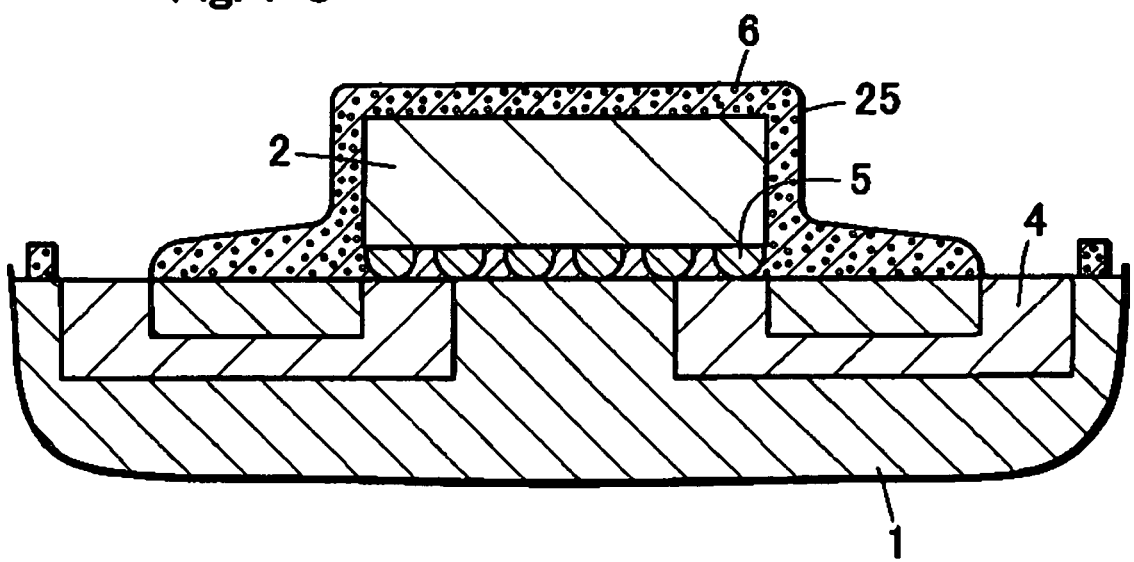

The semiconductor device according to sixth embodiment of the present invention will be described with reference to the accompanying drawings. FIG. 7A is a schematic perspective view showing the constitution of a coating film used when making the semiconductor device according to the sixth embodiment. FIG. 7B is a schematic sectional view of the coating film. FIG. 7C is a schematic sectional view showing the constitution of the semiconductor device according to the sixth embodiment. The sixth embodiment is similar to the first embodiment except for a different shape of the coating film 25 before being fastened onto the semiconductor light emitting element 2. In the description that follows, description on the shape of the semiconductor light emitting element 2 and other features that are similar to those of the first embodiment will be omitted.

In the sixth embodiment, the coating film 25 is a flat sheet. The coating film 25 has a through hole at a position that corresponds to the electrodes 4 exposed on the top face of the pedestal 80. The through hole is formed so as to allow the electrodes 4 to be exposed in predetermined size. The coating film 25 is made of denatured silicone resin. The fluorescent material 6 is mixed uniformly in the denatured silicone resin of the coating film 25.

The top face and the side face of the semiconductor light emitting element 2 constituted as described above and the top face of the pedestal 80 are covered by the coating film 25. The coating film 25 is aligned so that the through holes are located so as to correspond to the exposed portion of the electrode 4. In the sixth embodiment, the coating film 25 may be trimmed in conformity with the shape of the pedestal 1.

Embodiment 7

Figure 8:
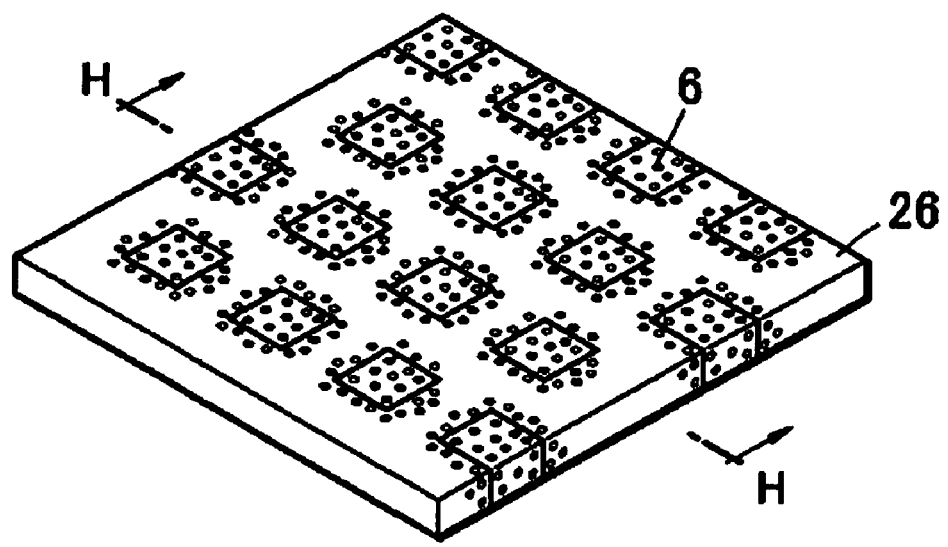
FIG. 8A is a schematic perspective view showing the coating film according to the seventh embodiment of the present invention.
FIG. 8B is a schematic sectional view showing the coating film in a section taken along lines H-H in FIG. 8A.
FIG. 8C is a schematic sectional view showing the semiconductor device according to the seventh embodiment of the present invention.
Figure 8:
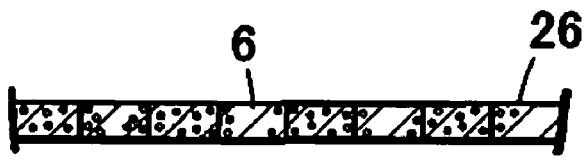
Figure 8:
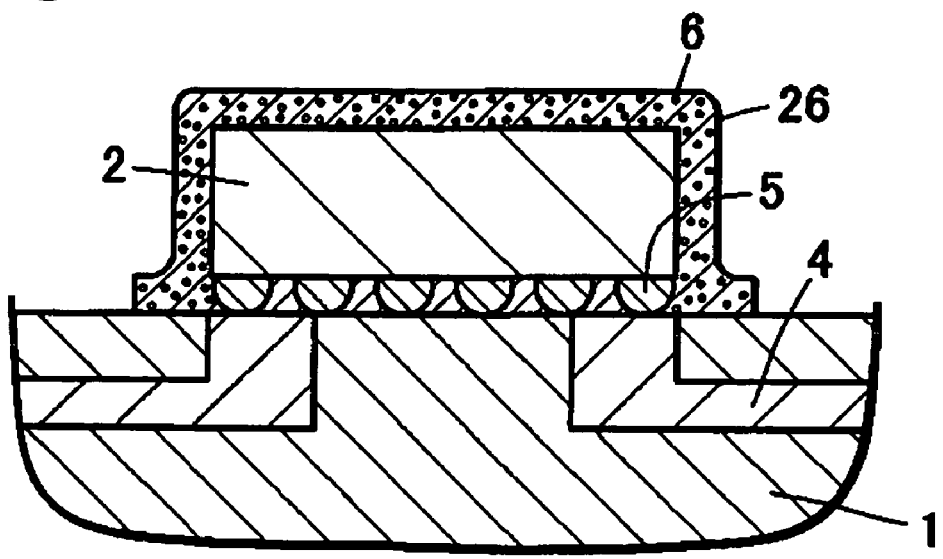

The semiconductor device according to seventh embodiment of the present invention will be described with reference to the accompanying drawings. FIG. 8A is a schematic perspective view showing the constitution of a coating film used when making the semiconductor device according to the seventh embodiment. FIG. 8B is a schematic sectional view showing the coating film. FIG. 8C is a schematic sectional view showing the semiconductor device according to the seventh embodiment. The seventh embodiment is similar to the first embodiment except for a different shape of the coating film 26 before being fastened onto the semiconductor light emitting element 2. In the description that follows, description on the shape of the semiconductor light emitting element 2 and other features that are similar to those of the first embodiment will be omitted.

The coating film 26 is a flat sheet. The coating film 26 contains the fluorescent material 6 in higher concentration in the portion thereof that corresponds to the semiconductor light emitting element 2. A cutting line is formed in the coating film 26 at a predetermined position corresponding to the semiconductor light emitting element 2. After fastening the coating film 26 onto the semiconductor light emitting element 2, the coating film 26 is removed except for the portion that is fastened onto the semiconductor light emitting element 2. At this time, the portion of the coating film 26 to be removed is separated from the rest along the cut made beforehand. This eliminates the need of the trimming operation, thus making it possible to manufacture the semiconductor device easily. The coating film 26 is made of silicone resin. In the seventh embodiment, the fluorescent material 6 and a dispersant are mixed uniformly in the silicone resin of the coating film 26. It is preferable to apply heat and pressure to the coating film 26 at the portion thereof corresponding to the semiconductor light emitting element 2, so as to prevent the semiconductor light emitting element 2 and the coating film 26 from coming apart from each other. Waste of the fluorescent material 6 caused when removing the coating film 26 can be reduced by containing larger amount of the fluorescent material 6 in the portion of the coating film 24 corresponding to the semiconductor light emitting element 2 and containing smaller amount of the fluorescent material 6 in the other portion of the coating film 26. The cut line in the coating film 26 can be formed by partial cutting by means of a curter or punching with a die.

The coating film 26 having the constitution described above is placed on the top face and the side face of the semiconductor light emitting element 2 and on the top face of the pedestal 1. In the semiconductor device constituted as described above, the coating film 26 covering from the top face and the side face of the semiconductor light emitting element 2 to the top face of the pedestal 1 has substantially uniform thickness.

The semiconductor device of the second through seventh embodiments can be manufactured by the method described in the first embodiment.

<Variation of the Manufacturing Method>

In the manufacturing method according to the first embodiment, the pedestal 80 is cut into the individual pedestals 1 after forming the coating film 3 on the top face of the semiconductor light emitting element 2 and the other portions and trimming the coating film 3 for each semiconductor light emitting element 2. According to the present invention, however, the coating film 3 may be trimmed for each semiconductor light emitting element 2 after forming the coating film 3 on the top face of the semiconductor light emitting element 2 and the other portions and cutting the pedestal 80 into hexagonal pieces.

Also according to the present invention, however, the coating film 3 may also be trimmed after disposing the pedestals 1 that have been cut off in advance on the back plate and forming the coating film 3 on the pedestals.

Figure 10:
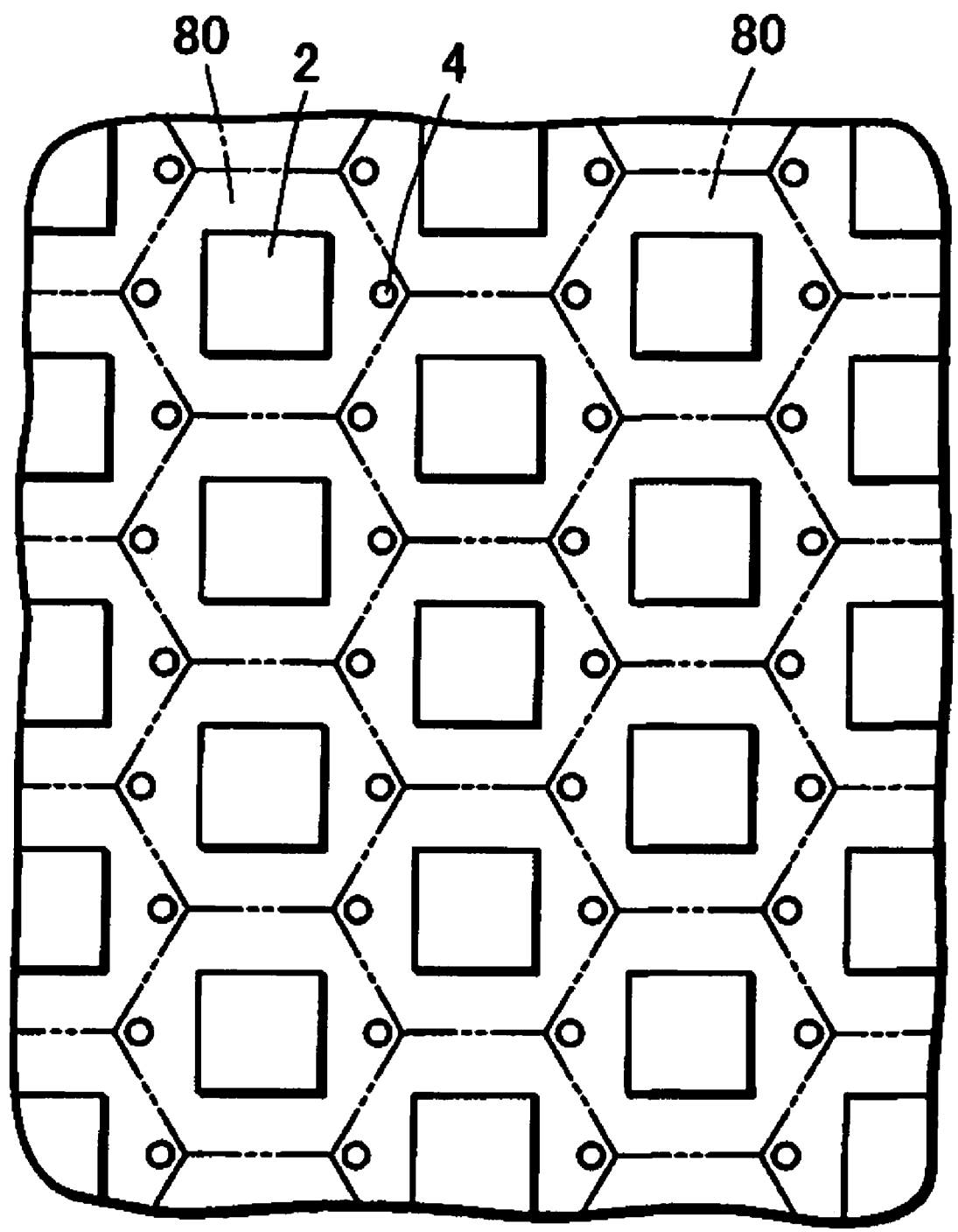
FIG. 10 is a schematic plan view showing the pedestals having the semiconductor light emitting element disposed on the top faces thereof being disposed, before the coating film is formed in a variation of the manufacturing method according to the present invention.
Figure 11:
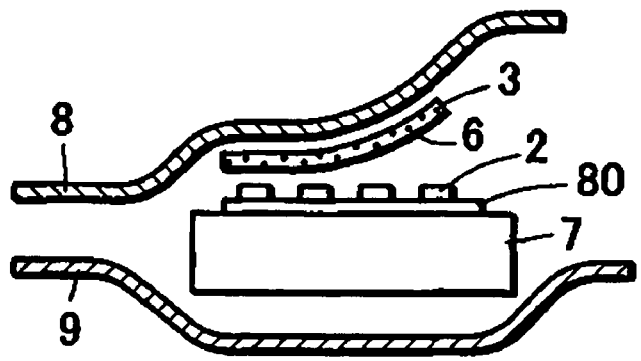
FIG. 11A is a sectional view schematically showing the process of forming the coating film on the pedestals having the semiconductor light emitting element disposed thereon between the first and second films in the method of manufacturing the semiconductor device according to the first embodiment of the present invention.
FIG. 11B is a sectional view schematically showing the process after laminating the first and second films in the method of manufacturing the semiconductor device according to the first embodiment.
FIG. 11C is a sectional view schematically showing the process of trimming the first and second films in the method of manufacturing the semiconductor device according to the first embodiment.
FIG. 11D is a sectional view schematically showing the process of removing the first and second films in the method of manufacturing the semiconductor device according to the first embodiment.
FIG. 11E is a sectional view schematically showing the process of trimming the coating film in the method of manufacturing the semiconductor device according to the first embodiment.
FIG. 11F is a sectional view schematically showing the process of dicing the pedestal in the method of manufacturing the semiconductor device according to the first embodiment.
FIG. 11G is a sectional view schematically showing the semiconductor device after separation in the method of manufacturing the semiconductor device according to the first embodiment.
Figure 11:
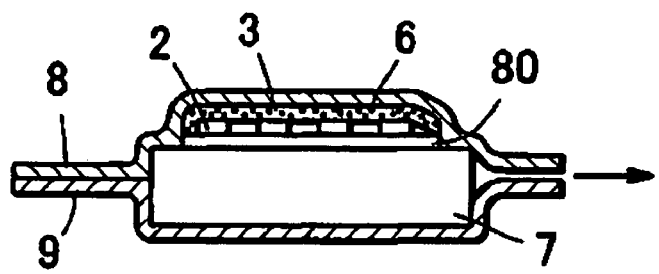
Figure 11:
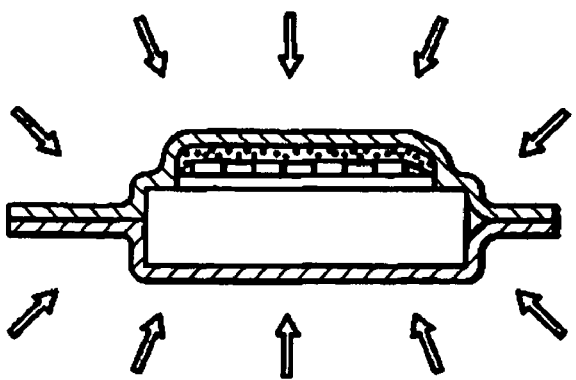
Figure 11:
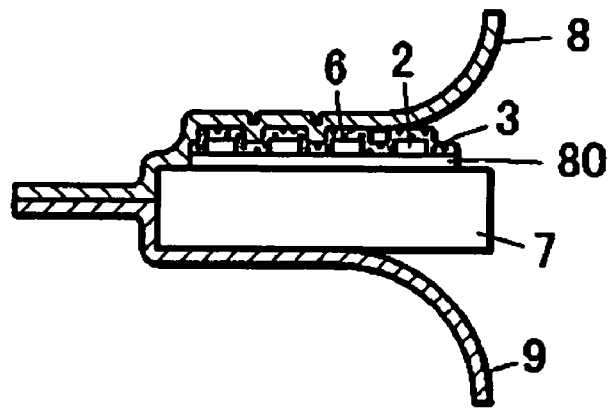
Figure 11:
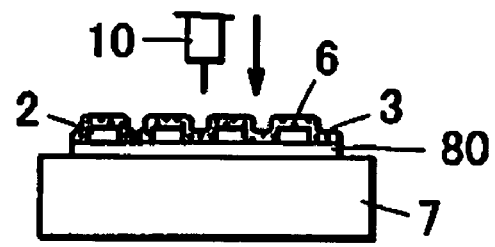
Figure 11:
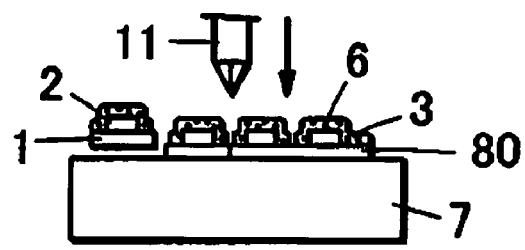
Figure 11:
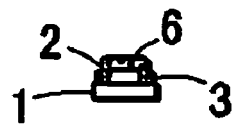

FIG. 10 is a schematic plan view showing the pedestals 1 having the semiconductor light emitting element placed on the top faces thereof being arranged on the back plate (not shown) before the process of forming the coating film.

In this case, the semiconductor devices 2 are mounted face down on the pedestals 1 with the electrode 4 having the predetermined electrically conductive pattern formed thereon. The pedestal 1 has hexagonal shape, and the semiconductor light emitting element 2 is placed at the center of the pedestal 1. The semiconductor light emitting element 2 having rectangular shape is placed so that two sides thereof are disposed parallel to two opposing parallel sides of the hexagonal shape of the pedestal 1. The pedestal 1 is cut into hexagonal shape in advance, and is placed on the back plate (not shown).

Then the coating film 3 is formed on the top face of the semiconductor light emitting element 2 mounted on the pedestal 1. After trimming the coating film 3 for the individual semiconductor light emitting elements 2, the pedestals 1 are removed from the back plate.

Unnecessary portion of the coating film 3 to be removed by trimming can be reduced thereby to utilize the coating film 3 effectively by first disposing a plurality of pedestals 1 whereon the semiconductor light emitting elements 2 have been mounted, then forming the coating film 3 and trimming it. It also enables it to prevent the coating film 3 from being broken as the pedestal 1 is cut off.

Embodiment 8

Figure 12:
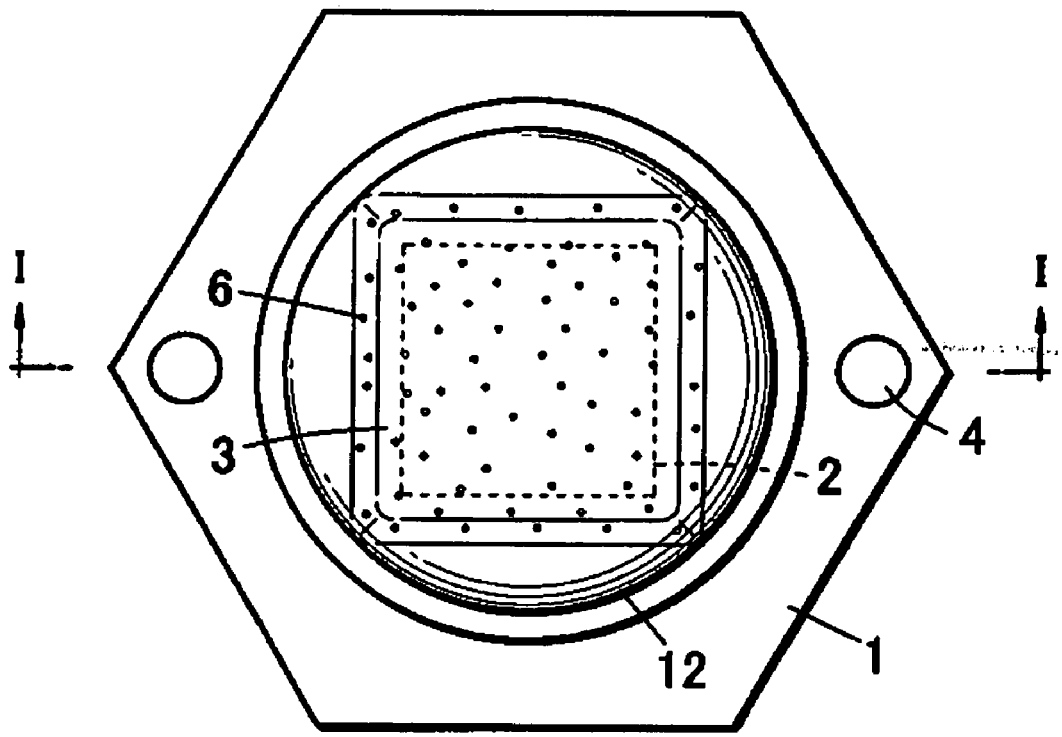
FIG. 12A is a schematic plan view showing the semiconductor device according to the present invention.
FIG. 12B is a schematic sectional view of the semiconductor device of the present invention in a section taken along lines I-I.
Figure 12:
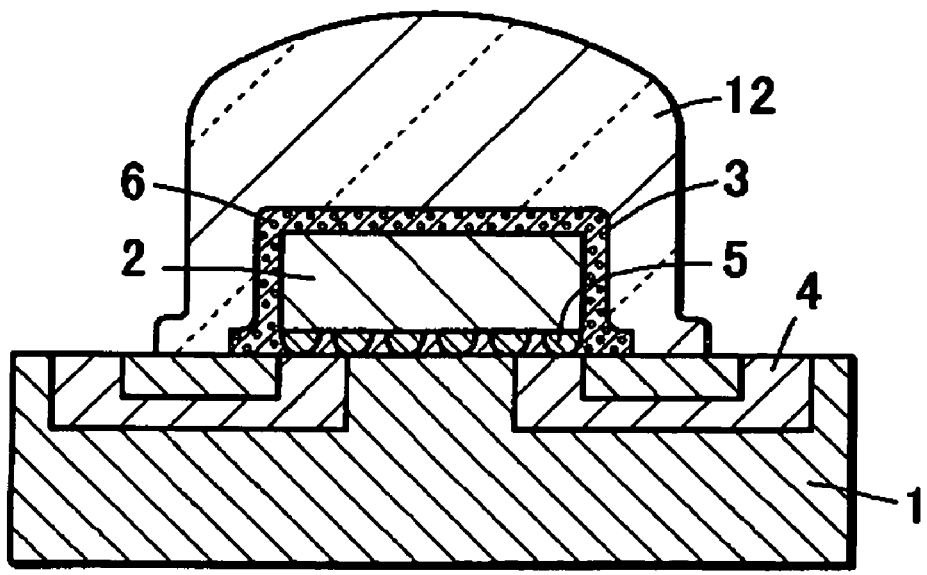

The semiconductor device provided with the coating member employing the semiconductor device obtained in the first to seventh embodiment will be described below as eighth embodiment. FIG. 12A is a schematic plan view showing the semiconductor device according to the eighth embodiment of the present invention. FIG. 12B is a schematic sectional view showing the semiconductor device according to the eighth embodiment. Description that follows deals with a case of the semiconductor device 100 of the first embodiment, although the invention is not limited to this constitution.

After forming the semiconductor device 100, the coating film 3 is covered on the outside thereof by a coating member 12 having a predetermined shape. The coating member 12 is preferably made of a translucent material, in order to extract light emitted by the fluorescent material 6 and light emitted by the semiconductor light emitting element 2 to the outside. The coating member 12 preferably has a lens shape, in order to improve the light collecting power and the directivity. The coating member 12 may include one of fluorescent material, pigment and dispersant. The coating member 12 is preferably harder than the coating film 3, in order to protect the coating film 3. The coating member 12 may be made of epoxy resin composition, silicone resin composition, acrylic resin composition or the like.

The coating member 12 is formed with a predetermined mold and is then applied to the semiconductor device 100. The coating member 12 is applied by immersing the semiconductor device 100 with the coating film 3 facing downward in a predetermined mold filled with a liquid silicone resin or epoxy resin, and hardening the coating member 12. After hardening, the semiconductor device is taken out and the semiconductor device provided with the coating member is complete.

Embodiment 9

Figure 13:
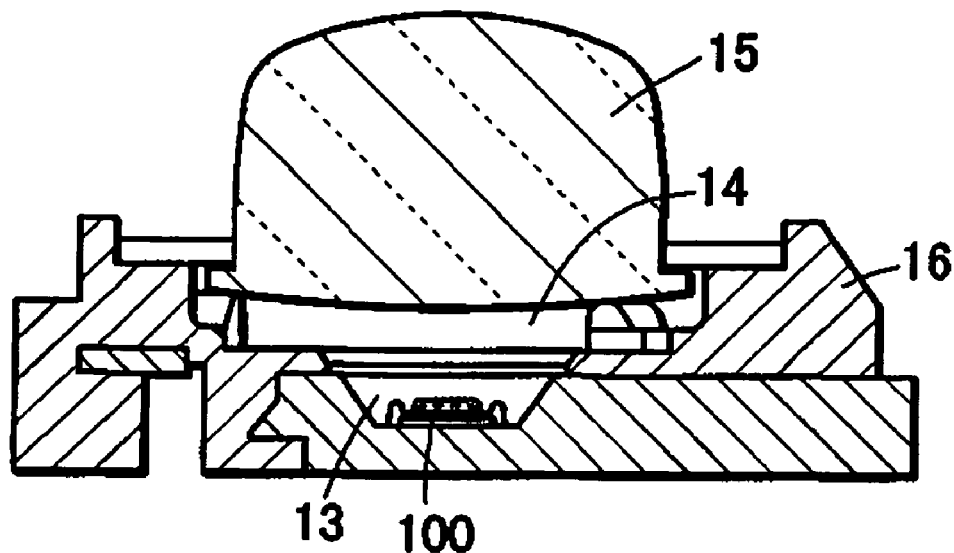
FIG. 13 is a schematic sectional view of the semiconductor device packaged in the semiconductor light emitting element according to the present invention.
Figure 14:
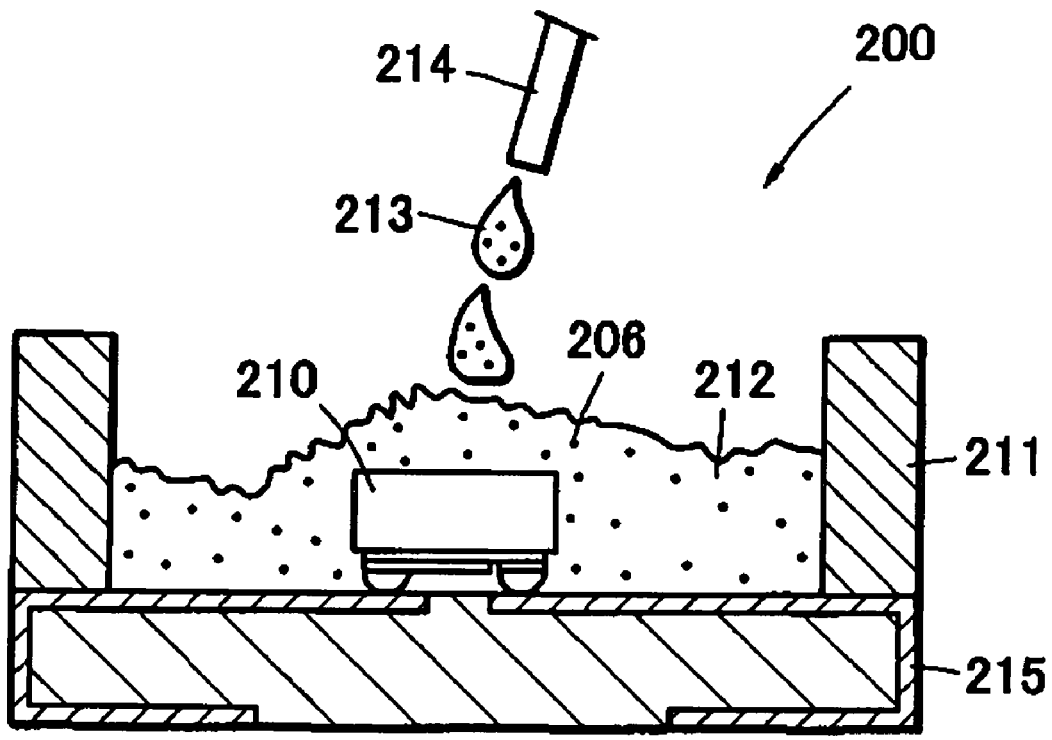
FIG. 14 is a sectional view schematically showing the prior art method of forming the coating film using potting means.
Figure 15:
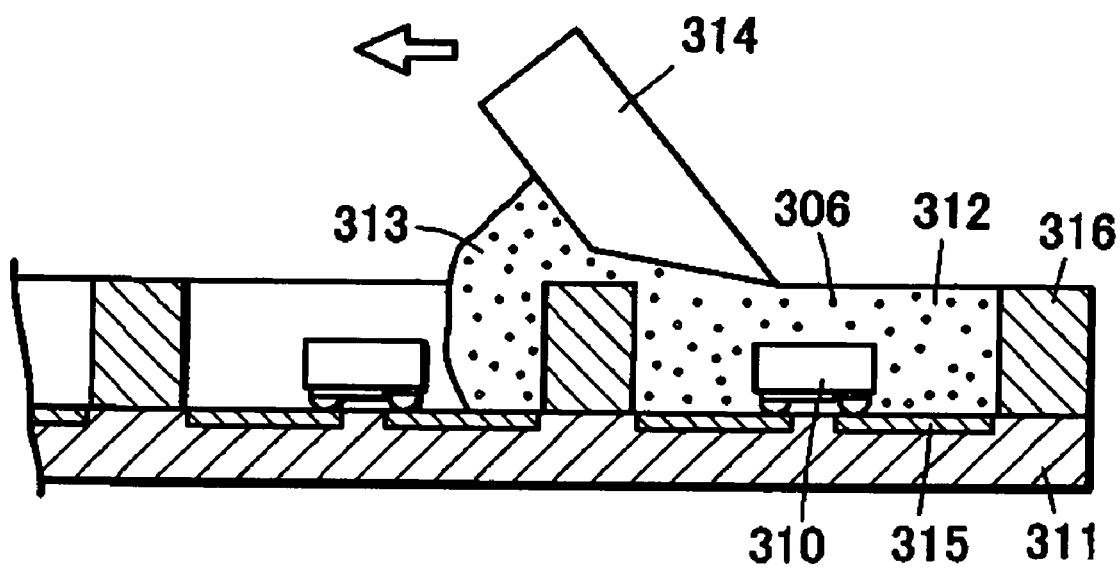
FIG. 15 is a sectional view schematically showing the prior art method of forming the coating film using screen printing means.

The semiconductor device provided with the coating member having a constitution different from that of the eighth embodiment employing the semiconductor device obtained in the first to seventh embodiment will be described below as ninth embodiment. FIG. 13 is a schematic sectional view showing a semiconductor light emitting element having the semiconductor device according to the present invention. Description that follows deals with a case of the semiconductor device 100 of the first embodiment, although the invention is not limited to this constitution.

After making the semiconductor device 100, it is mounted in a package 16 having the predetermined shape. The package 16 has an opening wider than bottom. The semiconductor device 100 is placed on the bottom. The semiconductor device 100 is bonded onto the bottom of the package 16 by using a die bond resin. The positive and negative electrodes 4 of the semiconductor device 100 are electrically connected to external electrodes of the package 16 via wires. An under coat 13 is put into the package 16 that has an opening, and a middle coat 14 is put thereon. The under coat 13 covers the semiconductor device 100 and the wires. A lens 15 is formed on the middle coat 14. The under coat 13, the middle coat 14 and the lens 15 are referred to as the coating member in this specification. The refractive indexes of the under coat 13, the middle coat 14 and the lens 15 become smaller in order of mention, so as to improve the efficiency of extracting light from the semiconductor device 100. The under coat 13 and the middle coat 14 may be formed from silicone resin or the like. The lens 15 may be made of epoxy resin, an inorganic glass or plastic glass.

Examples

Figure 2:
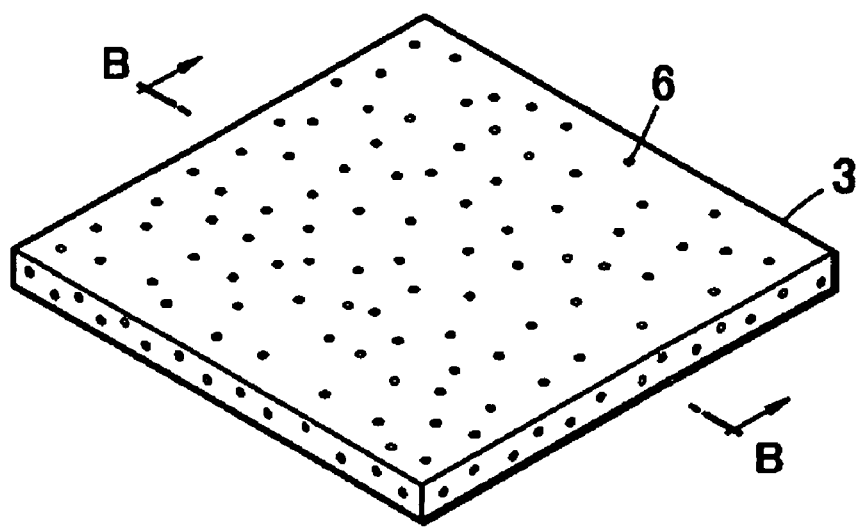
FIG. 2A is a schematic perspective view showing the coating film of the first embodiment.
FIG. 2B is a schematic sectional view showing a part of section taken along lines B-B' in FIG. 2A.
FIG. 2C is a schematic sectional view of the semiconductor device of the first embodiment.
Figure 2:
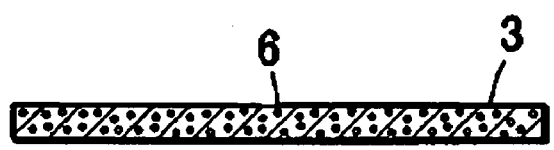
Figure 2:
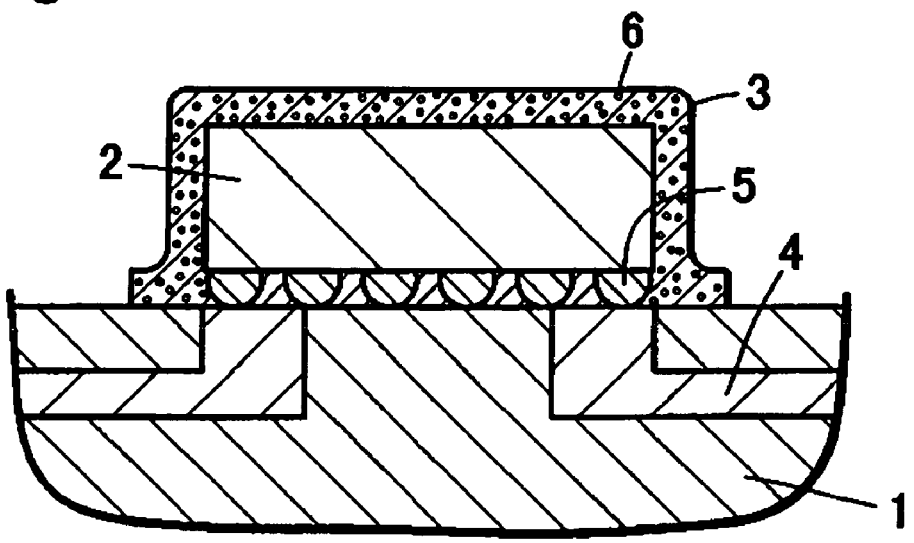

The semiconductor device 100 is made as shown in FIG. 1. In this example, the semiconductor light emitting element 2 is such that is mounted on the pedestal 80 face down as shown in FIG. 9.

The semiconductor light emitting element 2 employs InGaN semiconductor that has peak wavelength of emission near 460 nm. The semiconductor light emitting element 2 emits blue light. The semiconductor light emitting element 2 measures 1 mm square. The semiconductor light emitting element 2 is mounted face down on the top face of the pedestal 1. The pedestal 1 is made of glass epoxy resin having positive and negative electrodes 4 of predetermined electrical conductivity pattern disposed thereon. The electrodes 4 are made of Ag. Part of the positive and negative electrodes 4 are exposed so as to be electrically connected with the semiconductor light emitting element 2 and other part thereof are exposed so as to be electrically connected with external electrodes. The pedestal 1 has a hexagonal shape with one side thereof measuring about 1 mm.

The coating film 3 is formed on the top face and side face of the semiconductor light emitting element 2 that is mounted face down and on the top face of the pedestal 1. The coating film 3 contains the fluorescent material 6 mixed therein. The fluorescent material 6 is made by coprecipitating a solution of rare earth element such as Y, Gd Ce in an acid in stoichiometrical proportion with oxalic acid. An oxide made by burning the coprecipitate and aluminum oxide are mixed so as to obtain the stock material. The stock material and ammonium fluoride used as a flux are mixed and put into a crucible that is heated to 1400° C. in air for 3 hours. The fired material is crushed by a ball mil in water, then washed, separated and dried, so as to obtain $(Y, Gd)_3Al_5O_{12}$:Ce. The fluorescent material 6 and the coating film 3 are mixed uniformly in weight proportion of about 1:1. The coating film 3 is made of silicone resin (for example, KJR-9032 manufactured by Shin-Etsu Chemical Co., Ltd.). The coating film 3 is formed by rolling between at least two rotary drums. The rolling operation is repeated several times so as to form the coating film 3 of a predetermined thickness. The rolling operation is preferably carried out by repeating hot rolling and cold rolling. In this example, the coating film 3 having uniform thickness of about 75 μm is formed.

The back plate 7 is provided on the back of the pedestal 1 whereon the plurality of semiconductor light emitting elements 2 are mounted. The back plate 7 is made of ceramics. The pedestal 1 has through hole at predetermined position. The back plate 7 has protrusion at a position that corresponds to the through hole. The back plate 7 and the pedestal 1 are bonded together with an adhesive, so as to prevent the back plate 7 and the pedestal 1 from being displaced from each other.

The coating film 3 is stuck onto the top face and side face of the semiconductor light emitting element 2 and the top face of the pedestal 1. Then the back plate 7 is placed on the second film 9, and the first film 8 is placed gently on the top face of the coating film 3. Then the first film 8 and second film 9 are sealed by laminating except for a part of the periphery.

The semiconductor device covered by the laminated films is put into a predetermined container, the container is evacuated to vacuum. The space between the laminated films is also evacuated to purge air. After evacuating to make the inside vacuum, the part of the periphery of the laminated films that has been left open is sealed.

The laminated film is immersed in rubber that is kept at a temperature of about 120° C. After being immersed for about 1 minute, the laminated film is taken out and the first film 8 and second film 9 are removed gently so that the coating film 3 does not come off.

Then the coating film is trimmed along the periphery of the semiconductor light emitting element 2 with a cutting tool 10 such as a sharp edge. The coating film 3 is trimmed into a square of about 1.3 mm by cutting the coating film 3 between the adjacent semiconductor light emitting elements 2 with a width of about 1.5 mm. This enables it to form the coating film 3 having uniform thickness of about 75 µm on the top face and side face of the semiconductor light emitting element 2 and the top face of the pedestal 1. The external surface of the coating film located on the edge that is the intersect between the top face and the side face of the semiconductor light emitting element 2 has a rounded shape, and the external surface of the coating film located on the edge that is the intersect between the side face of the semiconductor light emitting element 2 and the top face of the pedestal 1 has a rounded shape.

Then the pedestal 1 is cut into hexagonal shape with the dicing saw 11. Cutting is done by dicing to a depth of about one third of the thickness, and then applying a force to break along the cut. The pedestal 1 is removed from the back plate 7 during or after cutting.

Through the process described above, the semiconductor device 100 is manufactured.

When current is supplied to the semiconductor device 100, blue light emitted by the semiconductor light emitting element 2 and yellow light emitted by the fluorescent material 6 are blended, so that the semiconductor device 100 emits light in white region. The semiconductor device 100 has very good directivity.

The semiconductor device that employs the semiconductor light emitting element according to the present invention can be used in such applications as lighting instruments, back light for cell phone or the like, traffic signal, and automobile lighting apparatus. It can also be used for semiconductor device that employs semiconductor element such as IC and LSI.

What is claimed is:

1. A method for manufacturing a semiconductor device that includes a pedestal and a semiconductor element placed on said pedestal, with at least a part of top face and side face of said semiconductor element and top face of said pedestal being covered by a coating film, said method comprising:
    a first process of successively placing at least said pedestal, said semiconductor element and said coating film one on another between a first film and a second film that are used in lamination process;
    a second process of laminating the first film and the second film on at least part thereof and bonded together in vacuum; and
    a third process of reducing a pressure in the space between the first film and the second film in vacuum so that the coating film is fastened onto at least a part of the top face and the side face of said semiconductor element and the top face of said pedestal.

2. The method of manufacturing the semiconductor device according to claim 1, wherein, a pressure is applied to said first film and said second film from the outside in the third process.

3. The method of manufacturing the semiconductor device according to claim 1, wherein a pressure is applied to said first film and said second film from the outside, and isotropic pressure pressing means is used as the means for applying said pressure in the third process.

4. The method of manufacturing the semiconductor device according to claim 1, wherein the space between said first film and said second film is heated in the third process or after the third process.

5. The method of manufacturing the semiconductor device according to claim 1 that, after said third process, includes:
    a process of removing the first film;
    a process of covering the top face of the semiconductor element that is covered by the coating film with a coating film of the same or different kind, between the third film and the second film or a fourth film which are used in lamination process;
    a process of laminating the third film and the second film or the fourth film on at least part thereof and bonded together in vacuum; and
    a process of reducing the pressure in the space between the third film and the second film or the fourth film in vacuum so that the top face of the semiconductor element that is covered by the coating film is bonded with a coating film of the same or different kind.

6. The method of manufacturing the semiconductor device according to claim 1, wherein a back plate is provided on a surface of the pedestal opposite to the surface thereof on which said semiconductor element is placed in said first process.

7. The method of manufacturing the semiconductor device according to claim 1, wherein said coating film in the first process contains a fluorescent material, a pigment or a dispersant.

8. The method of manufacturing the semiconductor device according to claim 1, wherein said coating film is made by using a silicone resin composition in the first process.

9. The method of manufacturing the semiconductor device according to claim 1, wherein said coating film has adhesiveness in the first process.

10. The method of manufacturing the semiconductor device according to claim 1, wherein said coating film consists of one or more film in the first process.

* * * * *